(12) United States Patent
Kitazaki et al.

(10) Patent No.: US 9,466,667 B2
(45) Date of Patent: Oct. 11, 2016

(54) SEMICONDUCTOR MEMORY DEVICE AND METHOD FOR MANUFACTURING SAME

(71) Applicant: Kabushiki Kaisha Toshiba, Minato-ku (JP)

(72) Inventors: Soichirou Kitazaki, Yokkaichi (JP); Mitsuru Sato, Kuwana (JP); Megumi Ishiduki, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/641,051

(22) Filed: Mar. 6, 2015

(65) Prior Publication Data

US 2016/0071926 A1 Mar. 10, 2016

Related U.S. Application Data

(60) Provisional application No. 62/048,551, filed on Sep. 10, 2014.

(51) Int. Cl.

| | |
|---|---|
| *H01L 29/06* | (2006.01) |
| *H01L 29/788* | (2006.01) |
| *H01L 29/51* | (2006.01) |
| *H01L 21/3213* | (2006.01) |
| *H01L 27/115* | (2006.01) |
| *H01L 21/28* | (2006.01) |
| *H01L 29/792* | (2006.01) |
| *H01L 29/66* | (2006.01) |
| *H01L 29/423* | (2006.01) |

(52) U.S. Cl.
CPC ..... *H01L 29/0649* (2013.01); *H01L 21/28008* (2013.01); *H01L 21/28273* (2013.01); *H01L 21/32133* (2013.01); *H01L 27/11521* (2013.01); *H01L 27/11568* (2013.01); *H01L 29/4234* (2013.01); *H01L 29/42324* (2013.01); *H01L 29/513* (2013.01); *H01L 29/66825* (2013.01); *H01L 29/66833* (2013.01); *H01L 29/788* (2013.01); *H01L 29/792* (2013.01)

(58) Field of Classification Search
CPC ....................... H01L 29/788; H01L 21/32133
See application file for complete search history.

(56) References Cited

U.S. PATENT DOCUMENTS 8,450,789 B2 * 5/2013 Bicksler ............... H01L 21/764
257/315
2011/0057251 A1 * 3/2011 Higashi ............ H01L 27/11578
257/324

(Continued)

FOREIGN PATENT DOCUMENTS

| JP | 2009-32967 | 2/2009 |
|---|---|---|
| JP | 2009-71184 | 4/2009 |
| JP | 2012-164900 | 8/2012 |
| JP | 2013-26431 | 2/2013 |

*Primary Examiner* — Lex Malsawma
(74) *Attorney, Agent, or Firm* — Oblon, McClelland, Maier & Neustadt, L.L.P.

(57) ABSTRACT

According to one embodiment, a semiconductor memory device includes a stacked body including a plurality of electrode layers separately stacked each other; a plurality of columnar sections provided in the stacked body and extending in a stacking direction of the stacked body; and a first insulating section separating the stacked body. The respective columnar sections include a semiconductor body extending in the stacking direction; and a charge storage film provided between the semiconductor body and the plurality of electrode layers. The first insulating section includes a first air gap.

20 Claims, 23 Drawing Sheets

(56) References Cited

U.S. PATENT DOCUMENTS

| | | | |
|---|---|---|---|
| 2012/0120740 A1* | 5/2012 | Shim | G11C 16/14 365/189.14 |
| 2012/0170375 A1* | 7/2012 | Sim | G11C 16/0483 365/185.19 |
| 2012/0182779 A1 | 7/2012 | Fukuda | |
| 2012/0256247 A1* | 10/2012 | Alsmeier | H01L 21/764 257/319 |
| 2013/0105902 A1* | 5/2013 | Uenaka | H01L 29/66833 257/368 |
| 2013/0228928 A1* | 9/2013 | Kuge | H01L 27/1157 257/760 |
| 2014/0242786 A1* | 8/2014 | Sato | H01L 29/66825 438/514 |

* cited by examiner

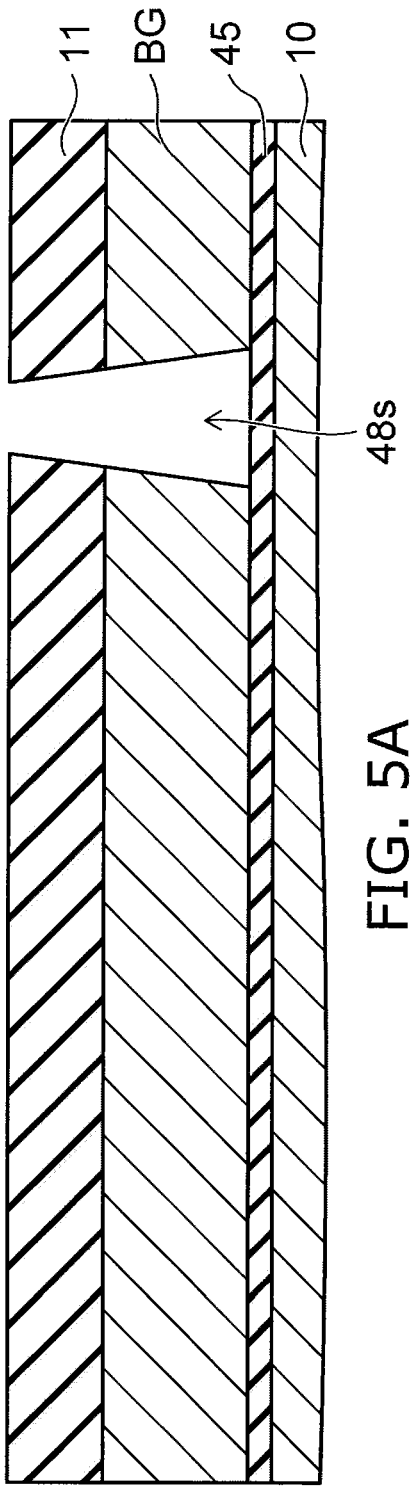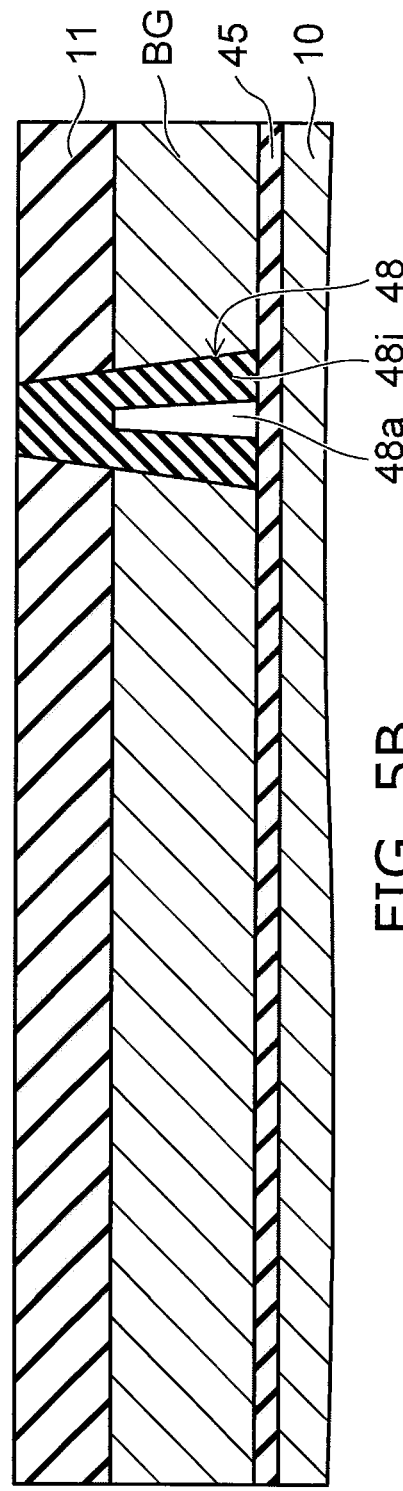

SEMICONDUCTOR MEMORY DEVICE AND METHOD FOR MANUFACTURING SAME

This application is based upon and claims the benefit of priority from U.S. Provisional Patent Application 62/048,551 field on Sep. 10, 2014; the entire contents of which are incorporated herein by reference.

FIELD

Embodiments described herein relate generally to a semiconductor memory device and a method for manufacturing same.

BACKGROUND

In a semiconductor memory device, there is a structure (an insulating and separating section or a device separating section) that electrically separates, for example, a memory cell, a back gate, and a selection gate. In the insulating and separating section, occurrence of a leak current, a decrease in a breakdown voltage, occurrence of parasitic capacitance, and the like could be problems.

BRIEF DESCRIPTION OF THE DRAWINGS

FIGS. 4, 5A, 5B, 6A, 6B, and 7-17 are schematic sectional views showing a method for manufacturing the semiconductor memory device of the embodiment;

DETAILED DESCRIPTION

Figure 1:
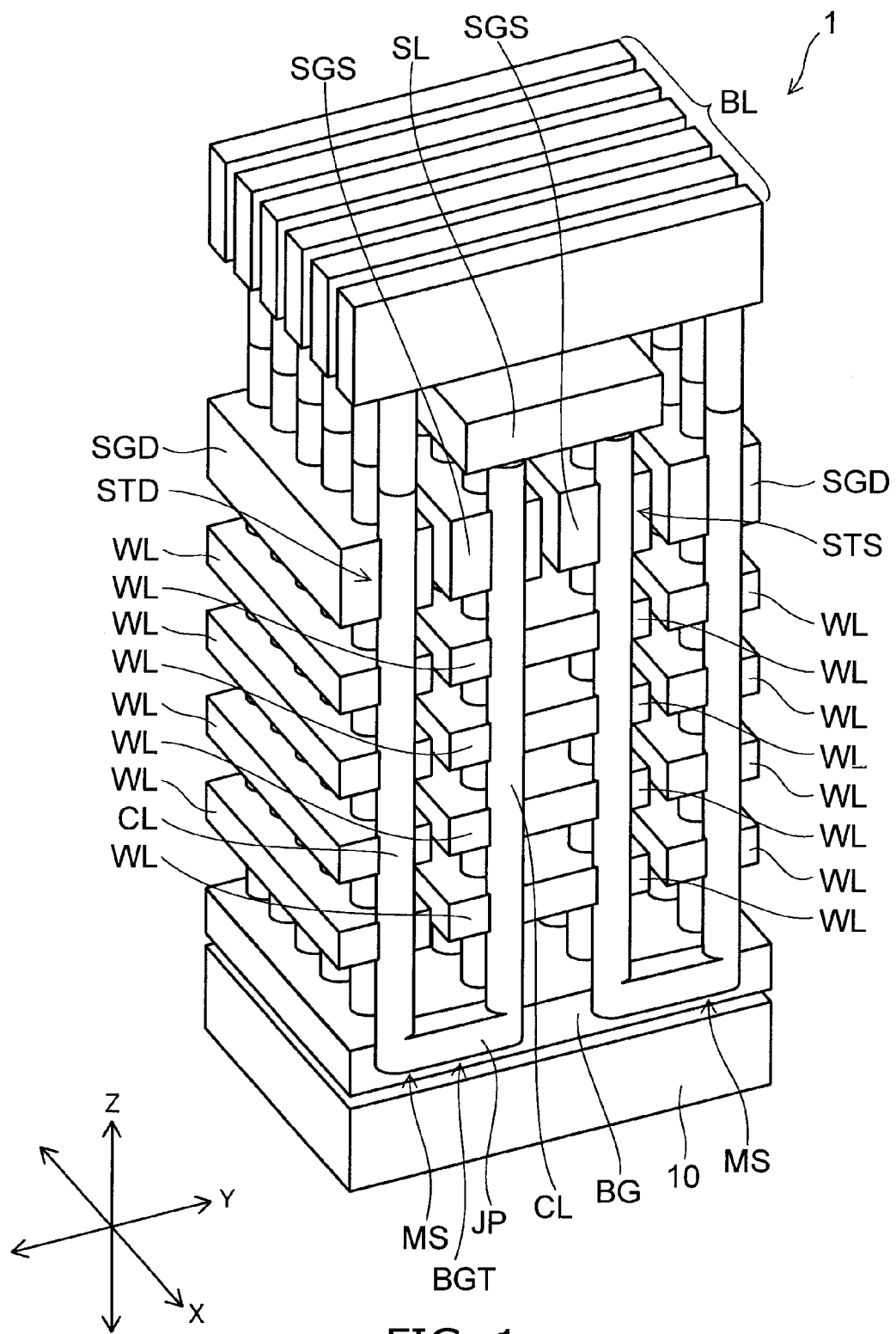
FIG. 1 is a schematic perspective view of a memory cell array of an embodiment.

According to one embodiment, a semiconductor memory device includes a stacked body including a plurality of electrode layers separately stacked each other; a plurality of columnar sections provided in the stacked body and extending in a stacking direction of the stacked body; and a first insulating section separating the stacked body. The respective columnar sections include a semiconductor body extending in the stacking direction; and a charge storage film provided between the semiconductor body and the plurality of electrode layers. The first insulating section includes a first air gap.

An embodiment is described below with reference to the drawings. Note that, in the drawings, the same components are denoted by the same reference numerals and signs.

FIG. 1 is a schematic perspective view of a memory cell array 1 of the embodiment. Note that, in FIG. 1, illustration of inter-layer insulating layers, insulating films, and the like is omitted to clearly show the figure.

In FIG. 1, two directions orthogonal to each other are represented as an X-direction and a Y-direction. A direction that is orthogonal to the X-direction and the Y-direction (an XY plane) and in which a plurality of electrode layers WL are stacked is represented as a Z-direction (a stacking direction).

Figure 2:
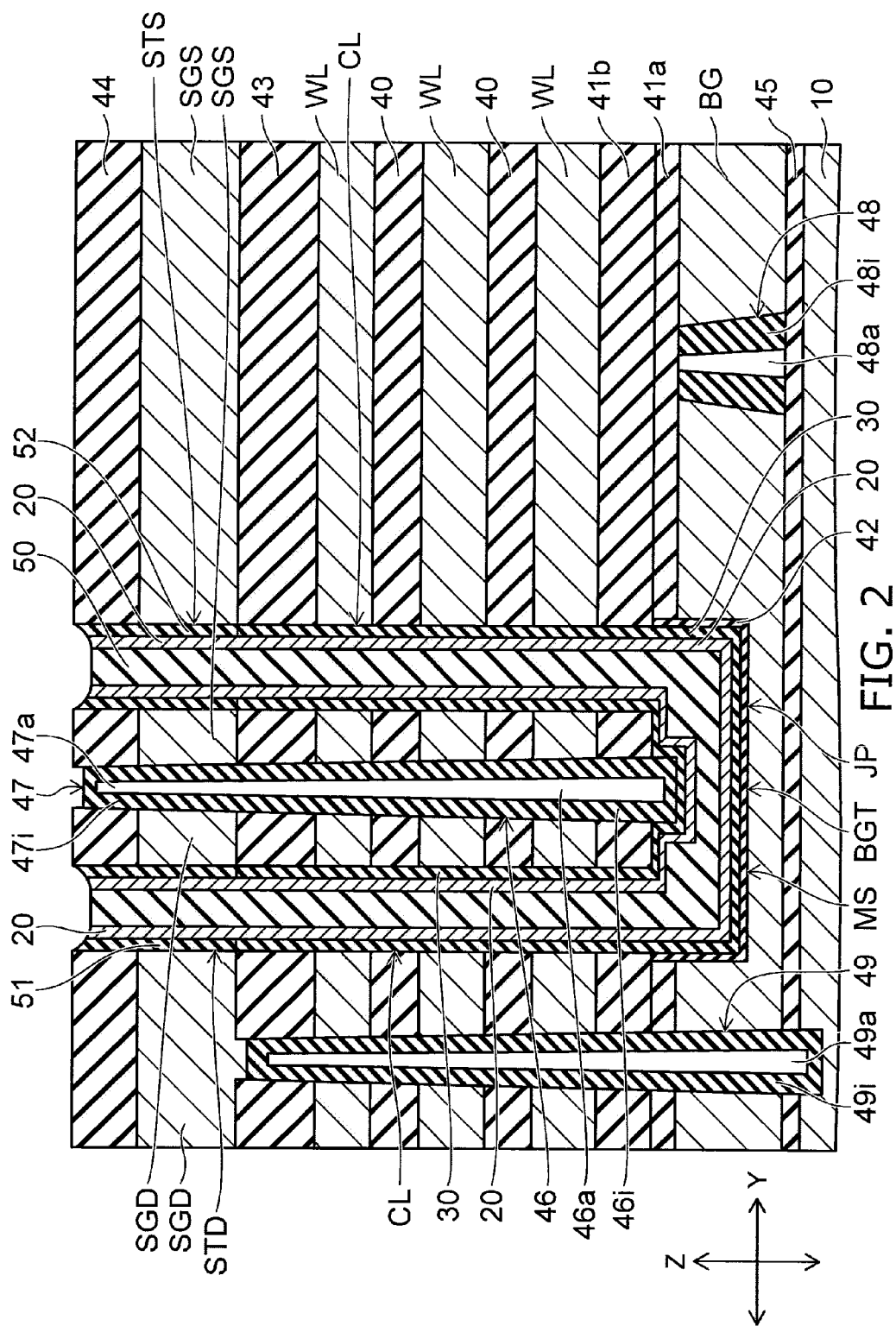
FIG. 2 is a schematic sectional view of the memory string of the embodiment.

The memory cell array 1 includes a plurality of memory strings MS. FIG. 2 is a schematic sectional view of the memory string MS. FIG. 2 shows a cross section parallel to a YZ plane in FIG. 1.

The memory cell array 1 includes a stacked body in which a plurality of electrode layers WL and a plurality of insulating layers 40 are alternately stacked. The plurality of electrode layers WL is separately stacked each other, and the insulating layers 40 are provided among the electrode layers WL. The stacked body is provided on a back gate BG functioning as a lower gate layer. Note that, the number of the electrode layers WL shown in the figure is an example. The number of the electrode layers WL may be any number. The back gate BG is provided on a substrate 10 via an insulating layer 45.

The back gate BG and the electrode layers WL are layers containing silicon as a main component and are, for example, polycrystalline silicon layers. Further, the back gate BG and the electrode layers WL contain, for example, boron as impurities for imparting electric conductivity to a silicon layer. The electrode layers WL may contain metal silicide. The insulating layers 40 mainly contain, for example, silicon oxide.

One memory string MS is formed in a U shape including a pair of columnar sections CL extending in the Z-direction and a joining section JP that joins the lower ends of the pair of columnar sections CL. The columnar sections CL are formed in, for example, a columnar or elliptical columnar shape and pierce through the stacked body to reach the back gate BG. The joining section JP only has to join, for example, at least the lower ends of the pair of columnar sections CL adjacent to each other. The joining section JP may join, for example, the lower ends of two or more columnar sections CL.

A drain side selection gate SGD is provided in one upper end section of the pair of columnar sections CL in the U-shaped memory string MS. A source side selection gate SGS is provided in the other upper end section. The drain side selection gate SGD and the source side selection gate SGS are provided on the top electrode layer WL via an interlayer insulating layer 43.

The drain side selection gate SGD and the source side selection gate SGS are layers containing silicon as a main component. Further, the drain side selection gate SGD and the source side selection gate SGS contain, for example, boron as impurities for imparting electric conductivity to a silicon layer.

The drain side selection gate SGD and the source side selection gate SGS functioning as an upper selection gate (an upper gate layer) and the back gate BG functioning as a lower selection gate are thicker than one electrode layer WL.

The drain side selection gate SGD and the source side selection gate SGS are separated in the Y-direction by an insulating and separating section 47 (a third insulating section). The stacked body under the drain side selection gate SGD and the stacked body under the source side selection gate SGS are separated in the Y-direction by an insulating and separating section 46 (a first insulating section). That is, the stacked body between the pair of columnar sections CL of the memory string MS is separated in the Y-direction by the insulating and separating sections 46 and 47.

In an example shown in FIG. 2, the insulating and separating section 46 and the insulating and separating section are integrally joined in the Z-direction (the stacking direction).

On the source side selection gate SGS, a source layer (e.g., a metal film) SL shown in FIG. 1 is provided via the insulating layer 44. On the drain side selection gate SGD and on the source layer SL, a plurality of bit lines (e.g., metal films) BL shown in FIG. 1 are provided via the insulating layer 44. The bit lines BL extend in the Y-direction.

Figure 3:
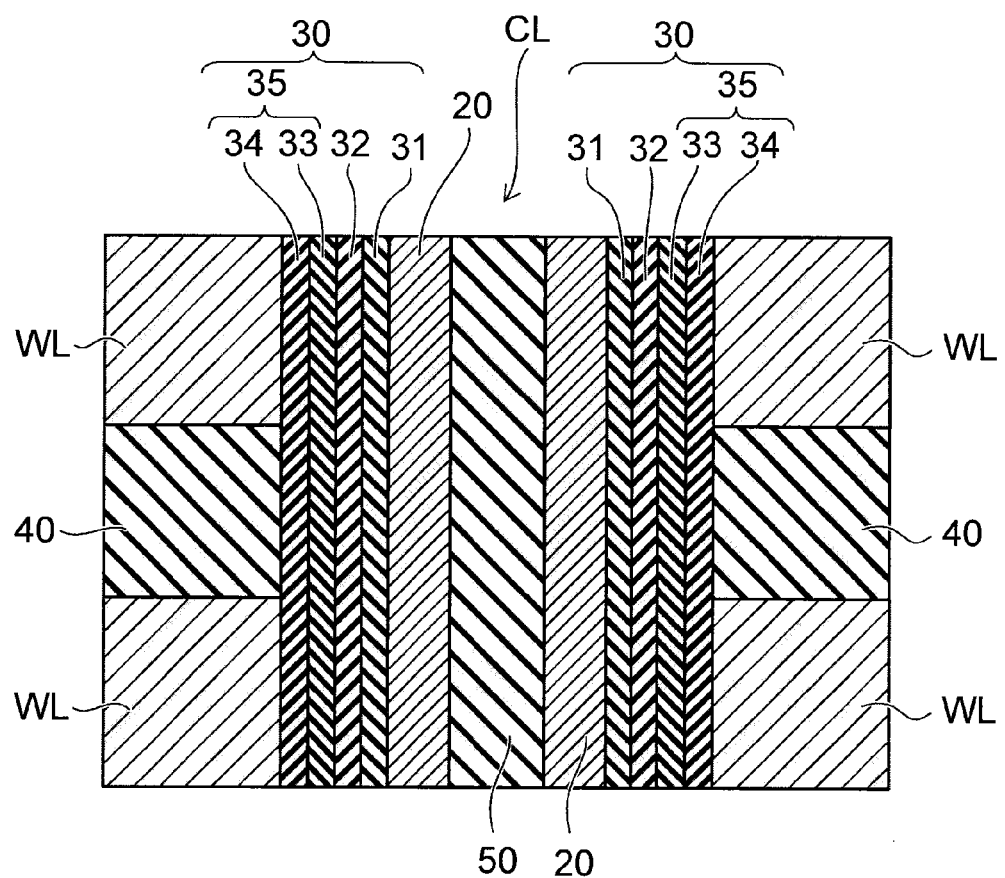
FIG. 3 is an enlarged schematic sectional view of a part of the columnar section of the embodiment.

FIG. 3 is an enlarged schematic sectional view of a part of the columnar section CL of the embodiment.

The columnar section CL is formed in a U-shaped memory hole formed in the stacked body including the plurality of electrode layers WL, the plurality of insulating layers 40, and the back gate BG. A channel body 20 (semiconductor body) functioning as a semiconductor channel is provided in the memory hole. The channel body 20 is, for example, a silicon film. The impurity concentration of the channel body 20 is lower than the impurity concentration of the electrode layers WL.

A memory film 30 is provided between the inner wall of the memory hole and the channel body 20. The memory film 30 includes a block insulating film 35, a change storage film 32, and a tunnel insulating film 31.

Between the electrode layers WL and the channel body 20, the block insulating film 35, the charge storage film 32, and the tunnel insulating film 31 are provided in order from the electrode layers WL side.

The channel body 20 is provided in a cylindrical shape extending in the stacking direction of the stacked body. The memory film 30 is provided in a cylindrical shape while extending in the stacking direction of the stacked body to surround the outer circumferential surface of the channel body 20. The electrode layers WL surround the channel body 20 via the memory film 30. A core insulating film 50 is provided on the inner side of the channel body 20. The core insulating film 50 is, for example, a silicon oxide film.

The block insulating film 35 is in contact with the electrode layers WL. The tunnel insulating film 31 is in contact with the channel body 20. The charge storage film 32 is provided between the block insulating film 35 and the tunnel insulating film 31.

The channel body 20 functions as a channel in memory cells. The electrode layers WL function as control gates of the memory cells. The charge storage film 32 functions as a data memory layer that stores charges injected from the channel body 20. That is, memory cells having structure in which the control gates surround the channel are formed in crossing portions of the channel body 20 and the electrode layers WL.

The semiconductor memory device of the embodiment is a nonvolatile semiconductor memory device that can freely electrically perform erasing and writing of data and retain stored contents even if a power supply is turned off.

The memory cells are memory cells of, for example, a charge trap type. The charge storage film 32 includes a large number of trap sites for capturing charges and is, for example, a silicon nitride film.

The tunnel insulating film 31 functions as a potential barrier when charges are injected into the charge storage film 32 from the channel body 20 or when charges stored in the change storage film 32 diffuse to the channel body 20. The tunnel insulating film 31 is, for example, a silicon oxide film.

As the tunnel insulating film 31, a stacked film (an ONO film) having structure in which a silicon nitride film is sandwiched by a pair of silicon oxide film may be used.

When the ONO film is used as the tunnel insulating film 31, an erasing operation can be performed with a low electric field compared with a single layer of a silicon oxide film.

The block insulating film 35 prevents the charges stored in the charge storage film 32 from diffusing to the electrode layers WL. The block insulating film 35 includes a cap film 34 provided in contact with the electrode layers WL and a block film 33 provided between the cap film 34 and the charge storage film 32.

The block film 33 is, for example, a silicon oxide film. The cap film 34 is a film having a dielectric constant higher than the dielectric constant of silicon oxide and is, for example, silicon nitride film. By providing such a cap film 34 in contact with the electrode layers WL, it is possible to suppress back tunnel electrons injected from the electrode layers WL during erasing. That is, by using a stacked film of the silicon oxide film and the silicon nitride film as the block insulating film 35, it is possible to improve charge blocking properties.

As shown in FIGS. 1 and 2, a drain side selection transistor STD is provided in the upper end section of one of the pair of columnar sections CL in the U-shaped memory string MS. A source side selection transistor STS is provided in the upper end section of the other.

The memory cells, the drain side selection transistor STD, and the source side selection transistor STS are vertical transistors in which an electric current flows in the stacking direction (the Z-direction) of the stacked body.

The drain side selection gate SGD functions as a gate electrode (a control gate) of the drain side selection transistor STD. An insulating film 51 (FIG. 2) functioning as a gate insulating film of the drain side selection transistor STD is provided between the drain side selection gate SGD and the channel body 20. The channel body 20 of the drain side selection transistor STD is connected to the bit lines BL above the drain side selection gate SGD.

The source side selection gate SGS functions as a gate electrode (a control gate) of the source side selection transistor STS. An insulating film 52 (FIG. 2) functioning as a gate insulating film of the source side selection transistor STS is provided between the source side selection gate SGS and the channel body 20. The channel body 20 of the source side selection transistor STS is connected to the source layer SL above the source side selection gate SGS.

In the joining section JP of the memory string MS, a back gate transistor BGT is provided. The back gate BG functions as a gate electrode (a control gate) of the back gate transistor BGT. The memory film 30 provided in the back gate BG functions as a gate insulating film of the back gate transistor BGT.

Between the drain side selection transistor STD and the back gate transistor BGT, a plurality of memory cells including the electrode layers WL as control gates are provided. Similarly, between the back gate transistor BGT and the source side selection transistor STS, a plurality of memory cells including the electrode layers WL as control gates are provided.

The plurality of memory cells, the drain side selection transistor STD, the back gate transistor BGT, and the source side selection transistor STS are connected in series through the channel body 20 and configure one U-shaped memory string MS. A plurality of the memory strings MS are arrayed in the X-direction and the Y-direction, whereby the plurality of memory cells are three-dimensionally provided in the X-direction, the Y-direction, and the Z-direction.

According to the embodiment, as shown in FIG. 2, in the insulating and separating section 46, an insulating film 46i (a first insulating film) and an air gap 46a (a first air gap) are formed. The insulating film 46i is formed on the sidewall of the insulating and separating section 46. The sidewalls of the electrode layers WL adjacent to the insulating and separating section 46 are covered with the insulating film 46i. The insulating film 46i is also formed in the bottom of the insulating and separating section 46.

The air gap 46a is formed on the inner side of the insulating film 46i. The outer circumference of the air gap 46a is surrounded by the insulating film 46i. The lower end of the air gap 46a is also covered with the insulating film 46i.

Similarly, in the insulating and separating section 47, an insulating film (a third insulating film) 47i and an air gap (a third air gap) 47a are formed. The insulating film 47i is formed on the sidewall of the insulating and separating section 47. The sidewalls of the drain side selection gate SGD and the source side selection gate SGS adjacent to the insulating and separating section 47 are covered with the insulating film 47i. The insulating film 47i is also formed in the upper end section of the insulating and separating section 47.

The air gap 47a is formed on the inner side of the insulating film 47i. The outer circumference of the air gap 47a is surrounded by the insulating film 47i. The upper end of the air gap 47a is also covered with the insulating film 47i.

The insulating film 46i and the insulating film 47i are integrally formed of the same material. In a closed region surrounded by the insulating film 46i and the insulating film 47i, the air gap 46a and the air gap 47a are joined in the stacking direction.

The insulating films 46i and 47i are insulating films containing at least any one or more of, for example, silicon nitride, silicon oxide, aluminum oxide, tantalum oxide, and titanium oxide.

The dielectric constant of the air gap 46a is lower than the dielectric constant of the insulating film 46i. The dielectric constant of the air gap 47a is lower than the dielectric constant of the insulating film 47i. Therefore, since the insulating and separating sections 46 and 47 include the air gaps 46a and 47a, it is possible to reduce parasitic capacitance, reduce a leak current, and improve a breakdown voltage in the insulating and separating sections 46 and 47.

The shape of the insulating and separating sections 46 and 47 shown in FIG. 2 is an example. The insulating and separating sections 46 and 47 may be formed independently from each other. That is, the air gap 46a and the air gap 47a may be divided in the stacking direction.

A back-gate insulating and separating section 48 (a second insulating section) is provided in the back gate BG. The back gate BG is separated into a plurality of regions by the back-gate insulating and separating section 48. In the back-gate insulating and separating section 48, an insulating film 48i (a second insulating film) and an air gap 48a (a second air gap) are formed. The insulating film 48i is provided on the sidewall of the back-gate insulating and separating section 48. The air gap 48a is provided on the inner side of the insulating film 48i. The air gap 48a is surrounded by the insulating film 48i.

The insulating film 48i is an insulating film containing at least any one or more of, for example, silicon nitride, silicon oxide, aluminum oxide, tantalum oxide, and titanium oxide.

In the back-gate insulating and separating section 48, the air gap 48a having a dielectric constant lower than the dielectric constant of the insulating film 48i is formed on the inner side of the insulating film 48i. The back-gate insulating and separating section 48 can reduce the influence on the back gate BG of the memory cell array, from a conductive layer (a conductive layer in which a layer same as the back gate BG is used) in the peripheral region of the back gate BG.

Further, according to the embodiment, a block insulating and separating section 49 (a device separating section in a block boundary), which separates the stacked body including the back gate BG and the plurality of electrode layers WL into a plurality of blocks, is provided. In the block insulating and separating section 49, as in the other insulating and separating sections, an insulating film 49i and an air gap 49a are formed.

The insulating film 49i is formed on the sidewall of the block insulating and separating section 49. The sidewalls of the back gate BG and the electrode layers WL adjacent to the block insulating and separating section 49 are covered with the insulating film 49i. The insulating film 49i is provided at the upper end and in the bottom of the block insulating and separating section 49.

The insulating film 49i is an insulating film including at least any one or more of, for example, silicon nitride, silicon oxide, aluminum oxide, tantalum oxide, and titanium oxide.

On the inner side of the insulating film 49i, the air gap 49a having a dielectric constant lower than the dielectric constant of the insulating film 49i is formed on the inner side of the insulating film 49i. The outer circumference and the upper and lower ends of the air gap 49a are surrounded by the insulating film 49i. The air gap 49a is formed in a closed region surrounded by the insulating film 49i.

The block insulating and separating section 49 can reduce parasitic capacitance, reduce a leak current, and improve a breakdown voltage between blocks.

As described above, according to the embodiment, by forming the air gaps in the insulating and separating sections 46 to 49 that separate devices including the conductive layers (the electrode layers WL, the selection gates SGD and SGS, and the back gate BG) to which a voltage is applied, it is possible to reduce parasitic capacitance, reduce a leak current, and improve a breakdown voltage between conductive devices. It is possible to realize improvement of reliability and an increase in speed of the semiconductor memory device.

When focused on an insulating and separating section between control gates, in a memory cell of a two-dimensional floating electrode structure, problems of the parasitic capacitance between the control gates and the like are present only in a channel direction. On the other hand, in the structure of a memory cell in three-dimensional structure, problems of parasitic capacitance, a leak, and the like are also present between the control gates (the electrode layers WL) opposed to each other in the Y-direction in FIG. 2 across the insulating and separating section 46 in addition to in the channel direction (the Z-direction in FIG. 2). This could be a significant problem when narrowing of an insulating and separating region is examined.

In the embodiment, parasitic capacitance and the like are reduced by forming an air gap in the insulating and separating section 46.

In order to prevent erroneous writing and improve reliability, a plurality of erroneous writing prevention voltages are sometimes applied to unselected memory cells. In that case, the voltage between the electrode layers WL opposed to each other via the insulating and separating section is larger than the voltage between electrode layers adjacent to each other in the channel direction. The reliability between the electrode layers WL could be deteriorated. Such a problem peculiar to the three-dimensional structure (a three-dimensional memory device) can be solved by the embodiment.

When focused on an insulating and separating section between selection gates, in the two-dimensional floating electrode structure, a source side selection gate and a drain side selection gate are not wired to be opposed in parallel to each other. However, in the three-dimensional structure memory device of the embodiment, the memory string extends in the direction perpendicular to the substrate. Consequently, the source side selection gate SGS and the drain side selection gate SGD are present in parallel. The parasitic capacitance between the selection gates and the like could be problems. Therefore, in the embodiment, it is possible to reduce the parasitic capacitance by forming the air gap 47a in the insulating and separating section 47 between the selection gates.

The back-gate insulating and separating section 48 (the device separating structure of the back gate BG) is focused on and described. The back gate BG is a structure peculiar to the three-dimensional structure (the three-dimensional memory) of the embodiment. In most cases, a voltage as high as the voltage applied between the electrodes WL and between the selection gates SGD and SGS is not applied to the back-gate insulating and separating section 48. However, because the back gate BG has a large volume with respect to the electrode layers WL, the influence from the conductive layer (the conductive layer in the same layer as the back gate BG) in the peripheral region around the back gate BG could be a problem.

According to the embodiment, the insulating and separating sections 48 and 49 provided in the back gate BG can reduce the influence on the back gate BG of the memory cell array region from the conductive layer in the peripheral region of the back gate BG. This is effective for an increase in the speed of an operation.

Each of the insulating and separating sections 46 to 49 shown in FIG. 2 extends in a direction piercing through the paper surface and separates the conductive layers (the electrode layers WL, the selection gates SGD and SGS, and the back gate BG) in the Y-direction.

As described above, in the embodiment, the air gap is formed in the insulating and separating section (the device insulating and separating section). An insulating film surrounding the air gap may be formed in the insulating and separating section. The insulating film contains at least any one or more of, for example, silicon nitride, silicon oxide, aluminum oxide, tantalum oxide, and titanium oxide. The insulating and separating section including the air gap can realize a high-speed operation and high reliability.

The sidewalls of the electrode layers WL separated by the insulating and separating section are covered with the insulating film. That is, the sidewalls of the electrode layers WL are not exposed to the air gap. Therefore, it is possible to prevent a leak current flowing in the stacking direction through the sidewalls adjacent to the insulating and separating section.

A method for manufacturing the semiconductor memory device of the embodiment is described with reference to FIG. 4 to FIG. 17.

Figure 4:
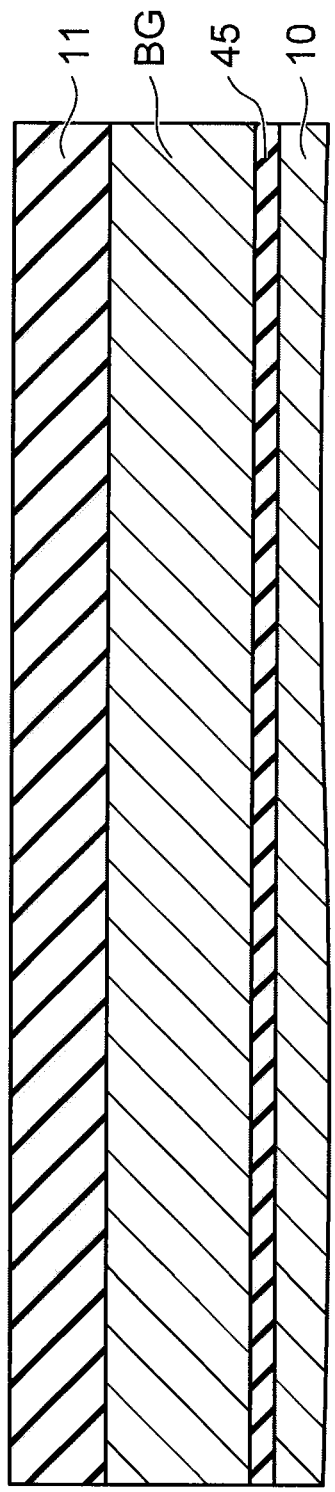

As shown in FIG. 4, the back gate BG is formed on the substrate 10 via the insulating layer 45. The back gate BG is, for example, a silicon layer added with impurities. The silicon layer is formed in the memory cell array region and a region around the memory cell array region. The silicon layer in the memory cell array region functions as the back gate BG of the memory string MS. The silicon layer in the peripheral region is formed on the substrate 10 in the peripheral region and used as a gate electrode material of a transistor of a control circuit that controls the memory cell array.

A stopper film 11 functioning as a stopper in CMP (Chemical Mechanical Polishing) in a later process is formed on the back gate BG. As the stopper film 11, for example, a silicon nitride film is used.

Subsequently, as shown in FIG. 5A, a slit 48s is formed by an RIE (Reactive Ion Etching) method using, as a mask, a not-shown mask layer formed on the stopper film 11. The slit 48s pierces through the stopper film 11 and the back gate BG to reach the insulating layer 45. The slit 48s extends in a direction piercing through the paper surface in FIG. 5A.

Conditions of the RIE in forming the slit 48s are controlled to form the slit 48s in a reverse taper shape (a shape in which the width on the lower end side is larger than the width on the upper end side). Consequently, it is possible to form an air gap in an insulating and separating section described below.

Thereafter, an insulating film 48i (e.g., a silicon oxide film or a silicon nitride film) is formed on the stopper film 11 and in the slit 48s. The width on the upper end (opening end) side of the slit 48s is smaller than the width on the lower end (bottom) side. Therefore, by appropriately controlling film formation conditions of the insulating film 48i, as shown in FIG. 5B, it is possible to close the upper end of the slit 48s with the insulating film 48i while leaving the air gap 48a in the slit 48s.

After the insulating film 48i is formed, the insulating film 48i formed on the stopper film 11 is removed by the CMP method (FIG. 5B).

Figure 6A:
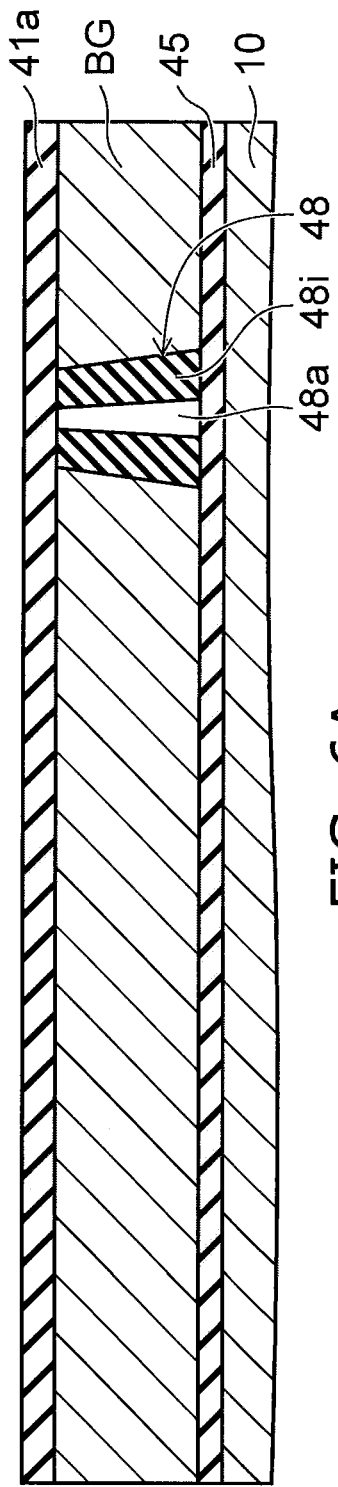

Subsequently, the stopper film 11 is removed by the RIE method. The insulating film 48i in the stopper film 11 is also removed. Thereafter, as shown in FIG. 6A, an insulating layer 41a is formed on the back gate BG. The insulating layer 41a is also formed on the insulating film 48i in the slit. Since the width of the air gap 48a is small, film formation conditions for the insulating layer 41a are appropriately controlled to close the upper end of the air gap 48a with the insulating layer 41a while leaving the air gap 48a.

Consequently, as shown in FIG. 6A, the back-gate insulating and separating section 48 including the air gap 48a is formed in the back gate BG. The insulating film 48i is formed on the sidewall of the back-gate insulating and separating section 48. The air gap 48a is formed on the inner side of the insulating film 48i. The air gap 48a is surrounded by the insulating film 48i, the insulating layer 45, and the insulating layer 41a. The width on the upper end side of the back-gate insulating and separating section 48 is smaller than the width on the lower end side.

Figure 6B:
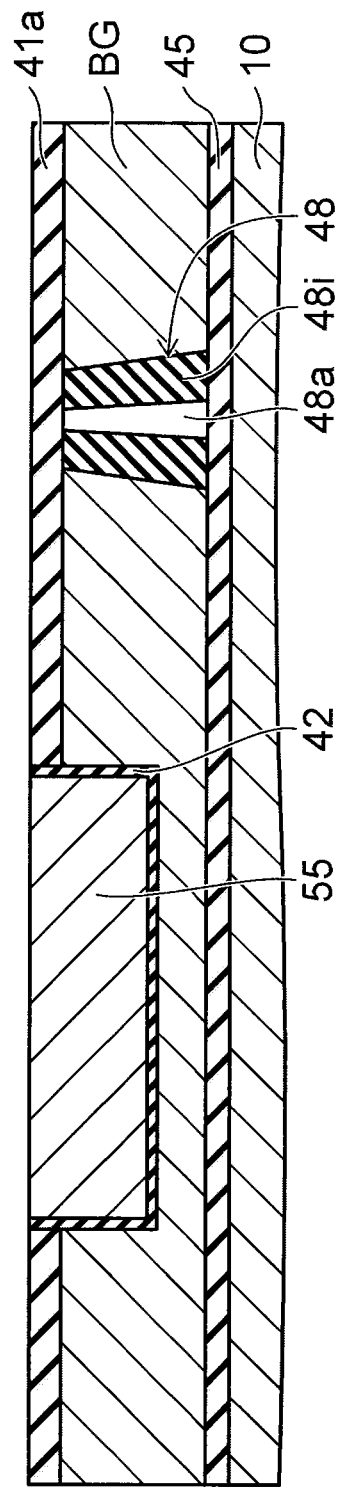

Subsequently, the insulating layer 41a and the back gate BG are etched by the RIE method using a not-shown mask layer formed on the insulating layer 41a to form a recessed section. Thereafter, a surface layer 42 (e.g., a silicon oxide layer) shown in FIG. 6B is formed on the surface of the recessed section by an RTO (Rapid Thermal Oxidation) method. After the surface layer 42 is formed, a sacrificial film 55 (e.g., an amorphous silicon film) is deposited by an LPCVD (Low Pressure Chemical Vapor Deposition) method. Thereafter, the sacrificial film 55 is recessed using the insulating layer 41a as a stopper by the RIE method.

Consequently, as shown in FIG. 6B, the surface of the sacrificial film 55 is formed on a plane same as the surface of the insulating layer 41a. The machining of the sacrificial film 55 may be performed by the CMP method.

Figure 7:
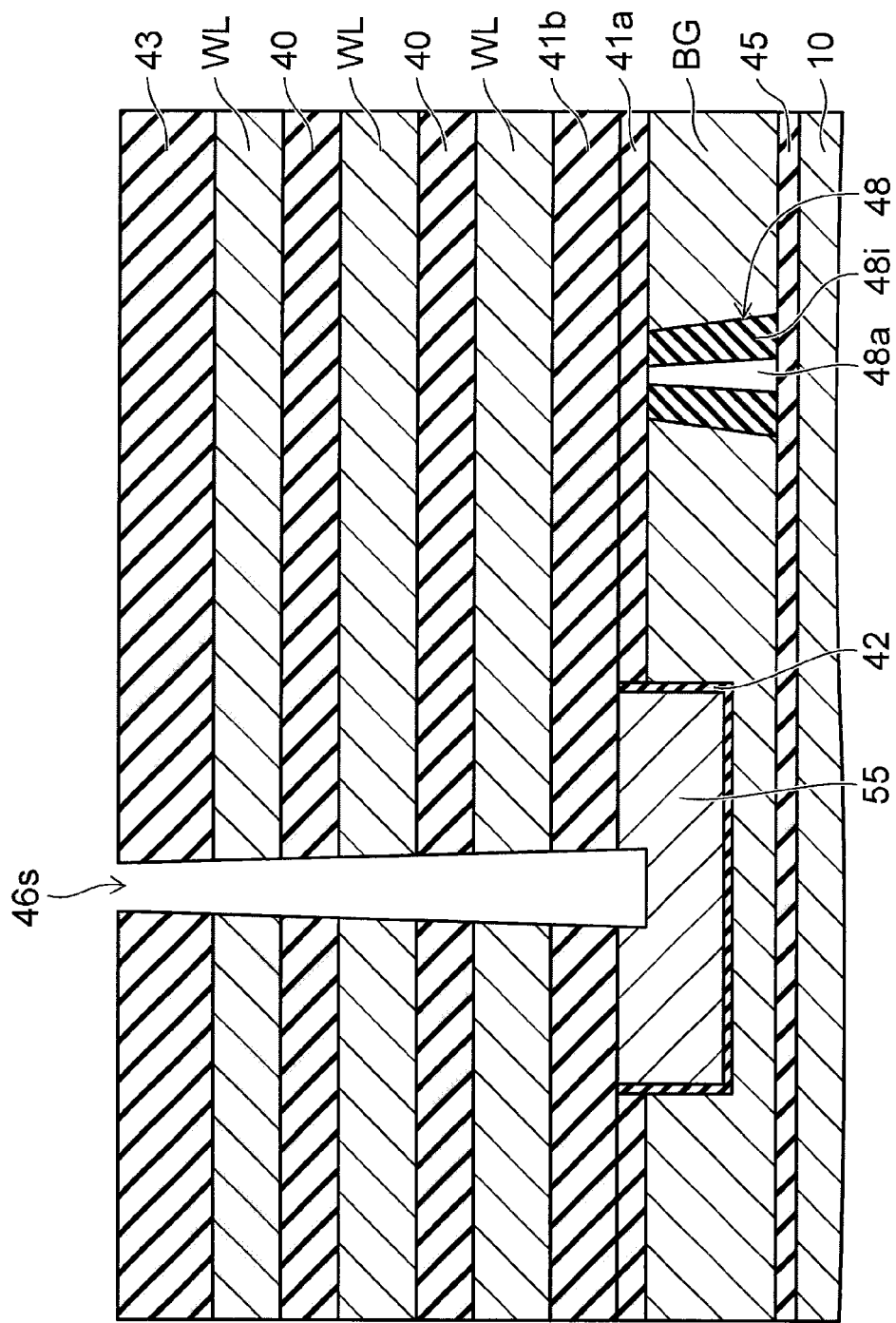

Subsequently, as shown in FIG. 7, an insulating layer 41b (e.g., a silicon oxide film) is formed on the insulating layer 41a and on the sacrificial film 55 by, for example, a PCVD (Plasma Chemical Vapor Deposition) method. The plurality of electrode layers WL and the plurality of insulating layers 40 are respectively alternately stacked on the insulating layer 41b. Consequently, a stacked body (a stack structure portion) is formed. Further, the interlayer insulating layer 43 is formed on the stacked body.

As shown in FIG. 7, a slit 46s is formed in the interlayer insulating layer 43 and the stacked body under the interlayer insulating layer 43.

The slit 46s is formed by the RIE method using a not-shown mask layer formed on the insulating layer 43. For example, the mask layer includes a carbon layer formed on the insulating layer 43 and a resist film formed on the carbon layer.

The slit 46s extends in the stacking direction of the stacked body piercing through the stacked body. The lower end of the slit 46s reaches the sacrificial film 55. The slit 46s extends in a direction piercing through the paper surface in FIG. 7 and separates the stacked body.

Conditions of the RIE are appropriately controlled to form the sidewall of the slit 46s in a reverse taper shape. That is, the width on the upper end (opening end) side of the slit 46s is smaller than the width on the lower end (bottom) side.

Thereafter, the insulating film 46i (e.g., a silicon oxide film or a silicon nitride film) is formed on the interlayer insulating layer 43 and in the slit 46s. The width on the upper end side of the slit 46s is small compared with the lower end side. Therefore, by appropriately controlling film formation conditions of the insulating film 46i, as shown in FIG. 8, it is possible to close the upper end of the slit 46s with the insulating film 46i while leaving the air gap 46a in the slit 46s.

After the insulating film 46i is formed, the insulating film 46i formed on the interlayer insulating layer 43 is removed by the RIE method.

Figure 8:
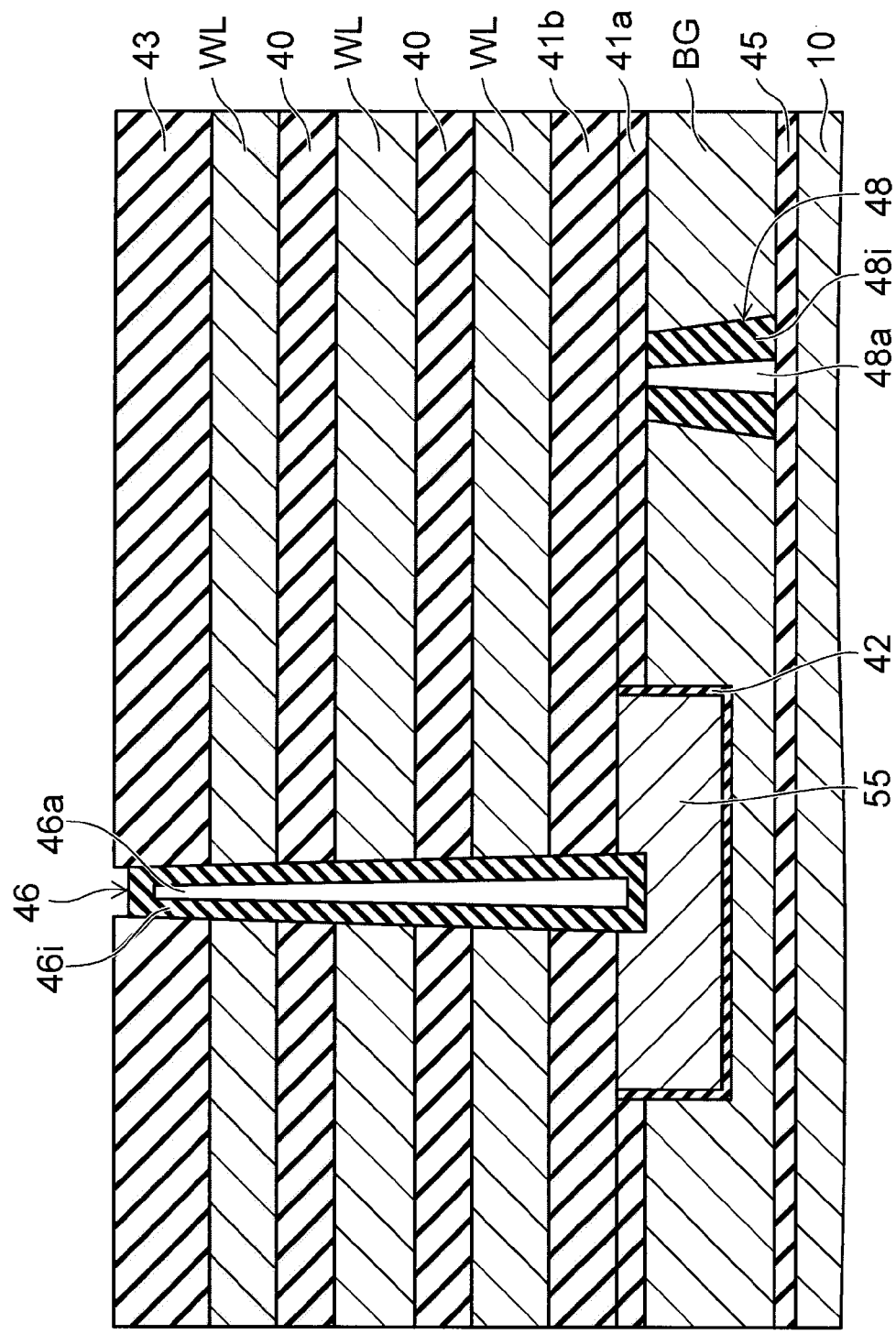

Consequently, as shown in FIG. 8, the insulating and separating section 46 (a device separating section of a memory cell) including the air gap 46a is formed in the stacked body. The insulating film 46i is formed on the sidewall of the insulating and separating section 46. The air gap 46a is formed on the inner side of the insulating film 46i. The sidewalls of the electrode layers WL adjacent to the insulating and separating section 46 are covered with the insulating film 46i. The insulating film 46i is also formed in the bottom of the insulating and separating section 46.

Figure 9:
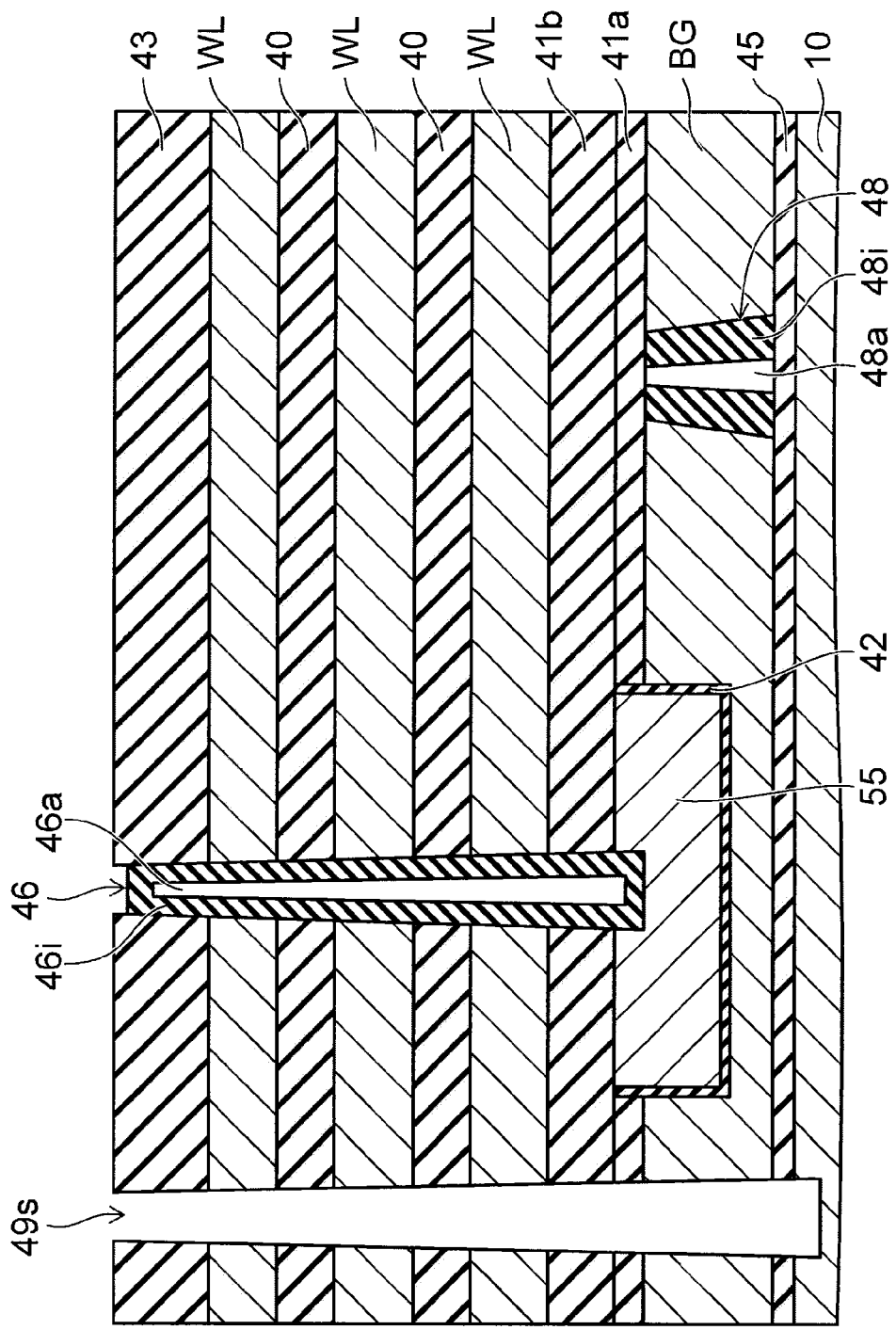

The outer circumference and the upper and lower ends of the air gap 46a are surrounded by the insulating film 46i. That is, the air gap 46a is formed in a region closed by the insulating film 46i. The width on the upper end side of the insulating and separating section 46 is smaller than the width on the lower end side As shown in FIG. 9, a slit 49s is formed in the interlayer insulating layer 43, the stacked body under the interlayer insulating layer 43, the back gate BG, and the substrate 10.

Like the slit 46s, the slit 49s is formed by the RIE method using a not-shown mask layer formed on the insulating layer 43. For example, the mask layer includes a carbon layer formed on the insulating layer 43 and a resist film formed on the carbon layer.

The slit 49s extends in the stacking direction of the stacked body piercing through the interlayer insulating layer 43 and the stacked body and the back gate BG under the interlayer insulating layer 43. The lower end of the slit 49s reaches the substrate 10. The slit 49s extends in a direction piercing through the paper surface in FIG. 9 and separates the stacked body and the back gate BG.

Conditions of the RIE are appropriately controlled to form the sidewall of the slit 49a in a reverse taper shape. That is, the width on the upper end (opening end) side of the slit 49s is smaller than the width on the lower end (bottom) side.

Thereafter, the insulating film 49i (e.g., the silicon oxide film or the silicon nitride film) is formed on the interlayer insulating layer 43 and in the slit 49s. The width on the upper end side of the slit 49s is small compared with the lower end side. Therefore, by appropriately controlling film formation conditions of the insulating film 49i, it is possible to close the upper end of the slit 49s with the insulating film 49i while leaving the air gap 49a in the slit 49s.

After the insulating film 49i is formed, the insulating film 49i formed on the interlayer insulating layer 43 is removed by the RIE method.

Figure 10:
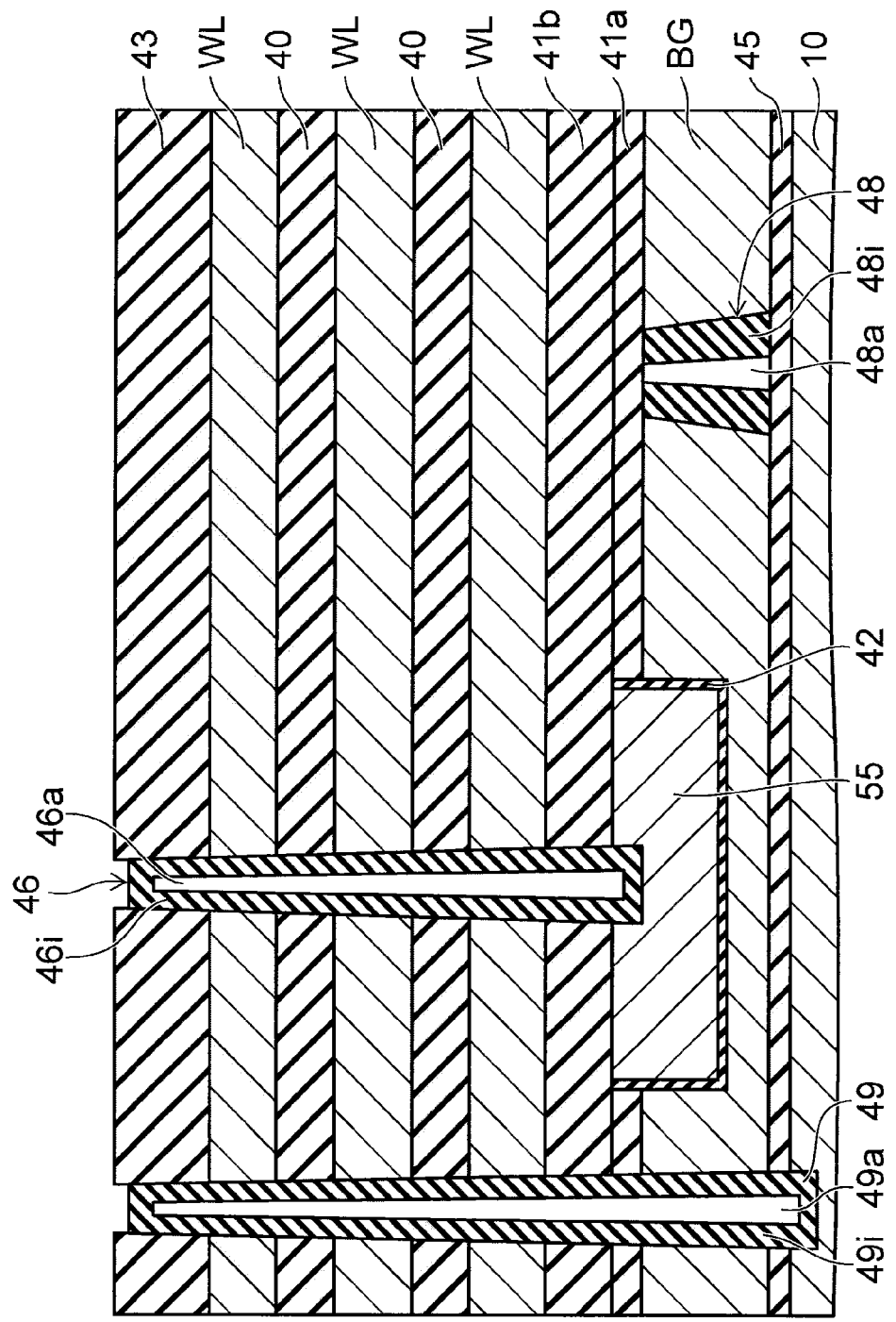

Consequently, as shown in FIG. 10, in the stacked body, the block insulating and separating section 49 (a block separating pattern) including the air gap 49a is formed. The insulating film 49i is formed on the sidewall of the block insulating and separating section 49. The air gap 49a is formed on the inner side of the insulating film 49i. The sidewalls of the back gate BG and the electrode layers WL adjacent to the block insulating and separating section 49 are covered with the insulating film 49i. The insulating film 49i is also formed in the bottom of the block insulating and separating section 49.

The outer circumference and the upper and lower ends of the air gap 49a are surrounded by the insulating film 49i. That is, the air gap 49a is formed in a closed region surrounded by the insulating film 49i. The width of the upper end side of the block insulating and separating section 49 is smaller than the width of the lower end side.

Figure 11:
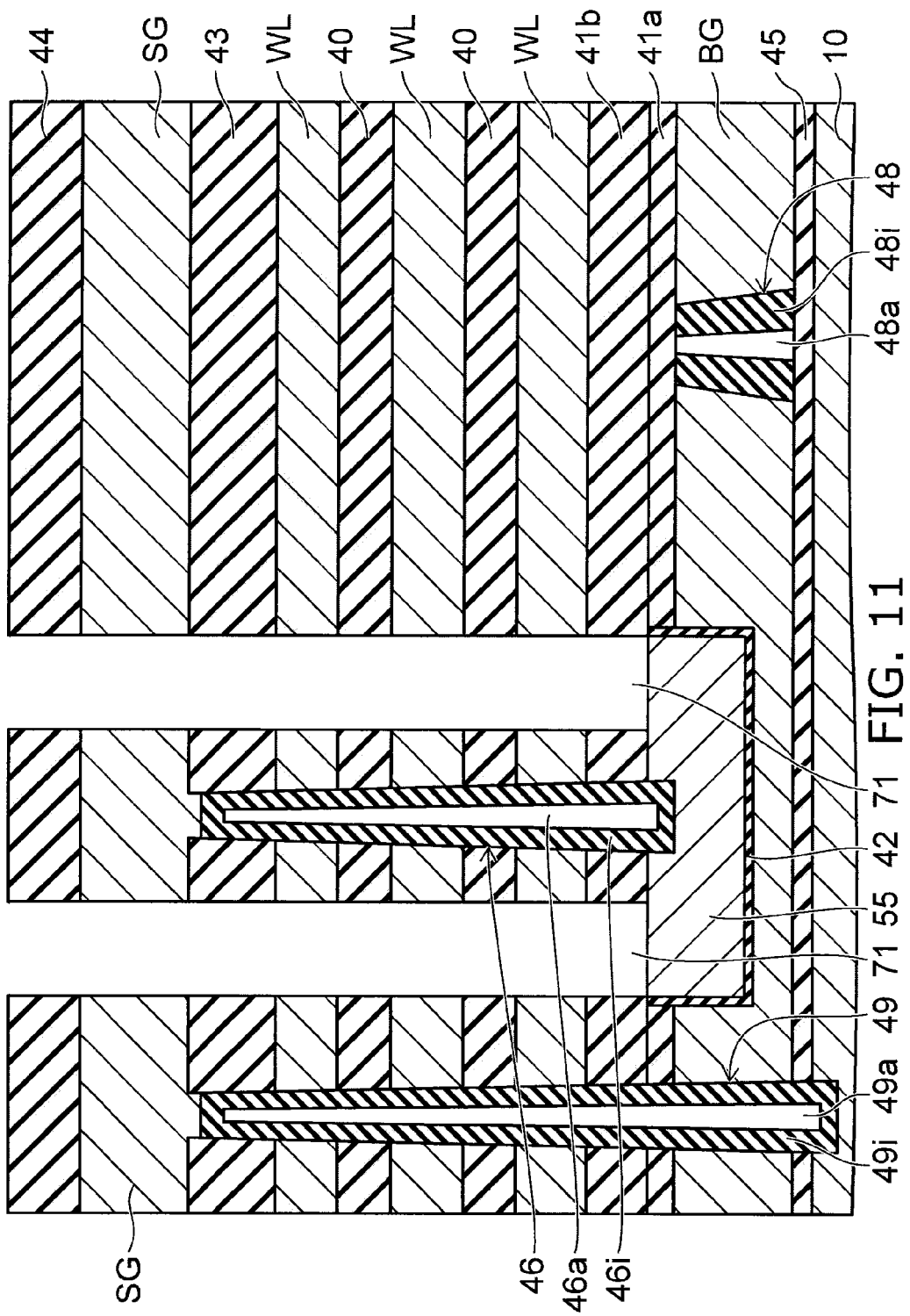

Subsequently, a selection gate SG, which changes to the drain side selection gate SGD or the source side selection gate SGS, is formed on the interlayer insulating layer 43 as shown in FIG. 11. Further, the insulating layer 44 is formed on the selection gate SG.

Thereafter, as shown in FIG. 11, a plurality of holes 71 are formed in the stacked body including the insulating layer 44, the selection gate SG, and the electrode layer WL. The holes are formed by, for example, the RIE method using a not-shown mask.

The lower ends of the holes 71 reach the sacrificial film 55. The sacrificial film 55 is exposed to the bottoms of the holes 71. A pair of holes 71 is formed on one sacrificial film 55.

After the holes 71 are formed, the sacrificial film 55 is removed by etching performed via the holes 71. The sacrificial film 55 is removed by, for example, a wet etching method. As a chemical for the wet etching method, for example, trimethyl-2-hydroxyethyl ammonium hydroxide (TMY: $[CH_3]_3NCH_2CH_2OH]^+OH^-$) is used.

Figure 12:
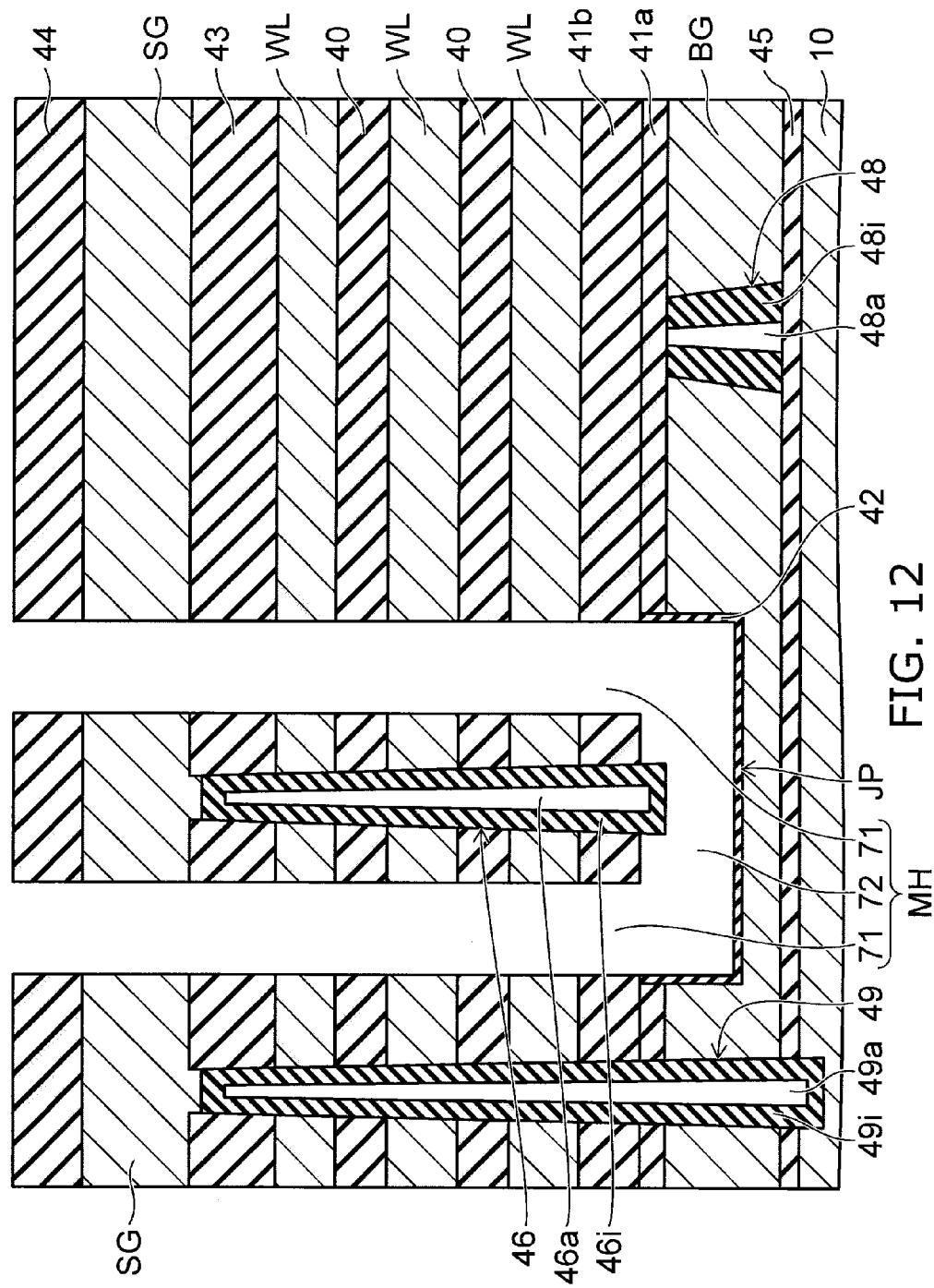

According to the removal of the sacrificial film 55, as shown in FIG. 12, a recessed section 72 formed in the back gate BG appears. A pair of holes 71 is joined to one recessed section 72. That is, the lower ends of the pair of holes 71 are joined to one common recessed section 72. One U-shaped memory hole MH is formed.

Figure 13:
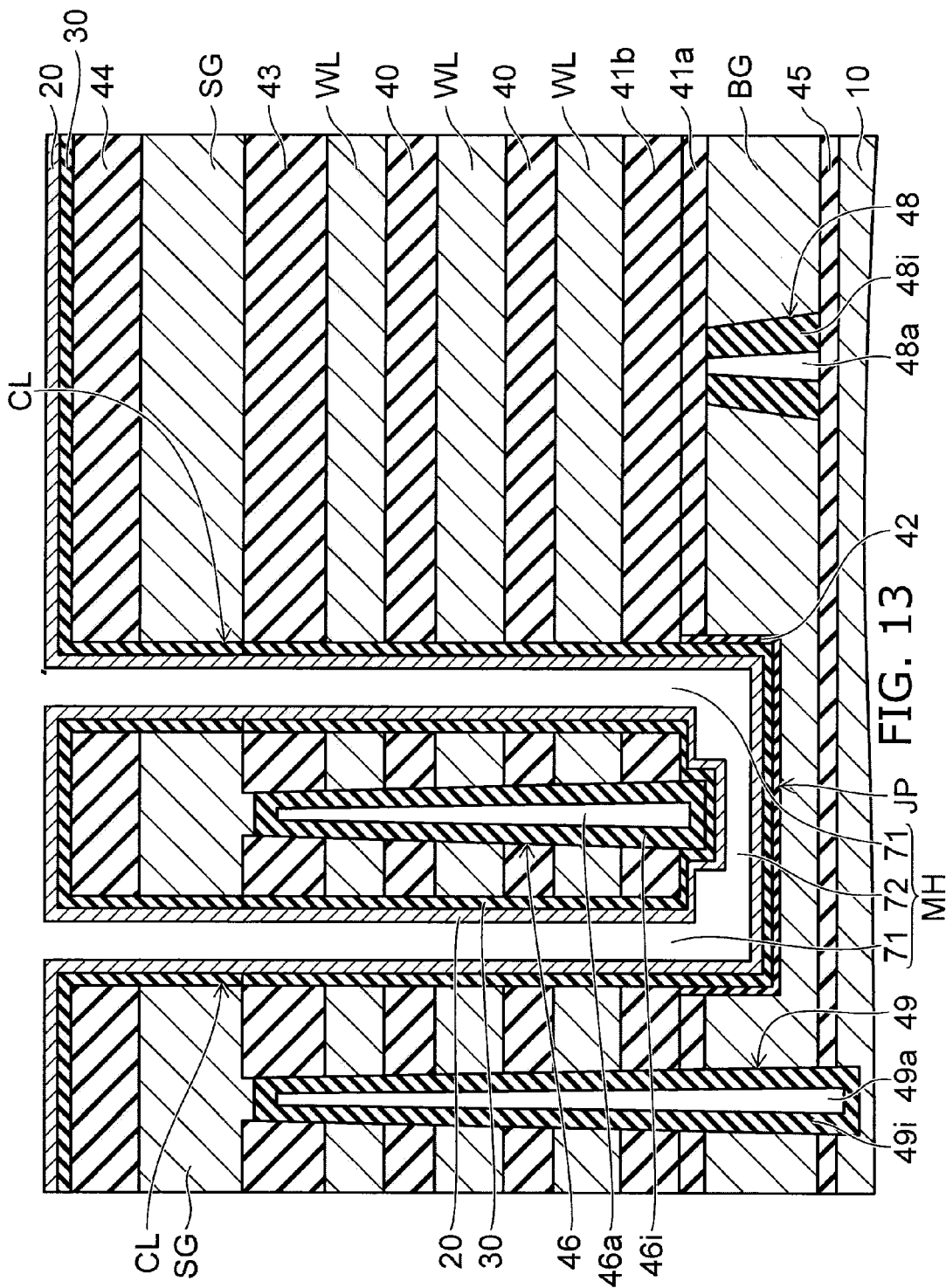

After the memory hole MH is formed, as shown in FIG. 13, on the inner wall of the memory hole MH, the memory film 30 (e.g., a multilayer film including $SiN/SiO_2/Al_2O_3$) and the channel body 20 shown in FIG. 3 are formed in order. Consequently, the columnar sections CL are formed.

Figure 14:
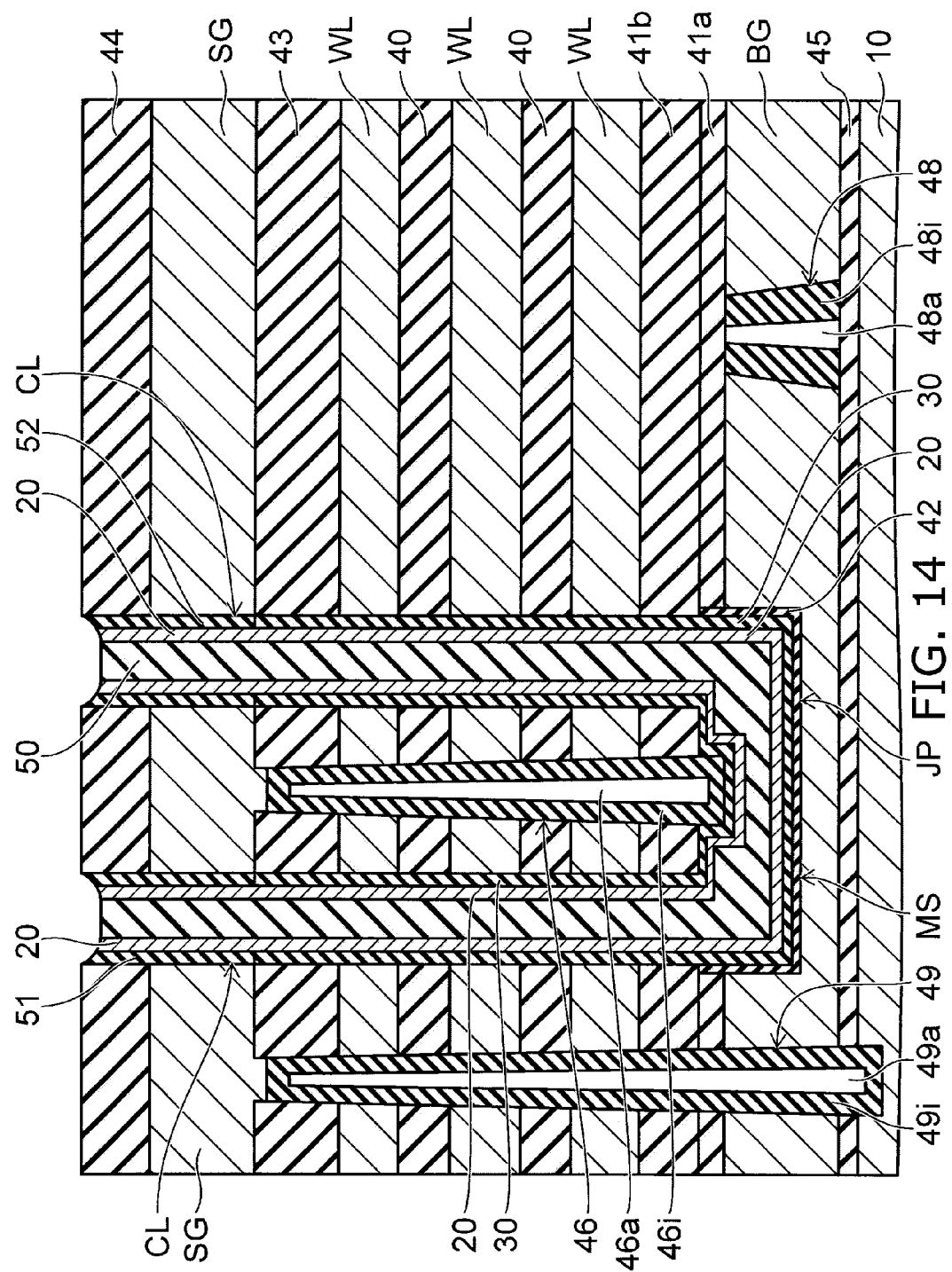

Subsequently, as shown in FIG. 14, the core insulating film 50 is formed on the inner side of the channel body 20.

Figure 15:
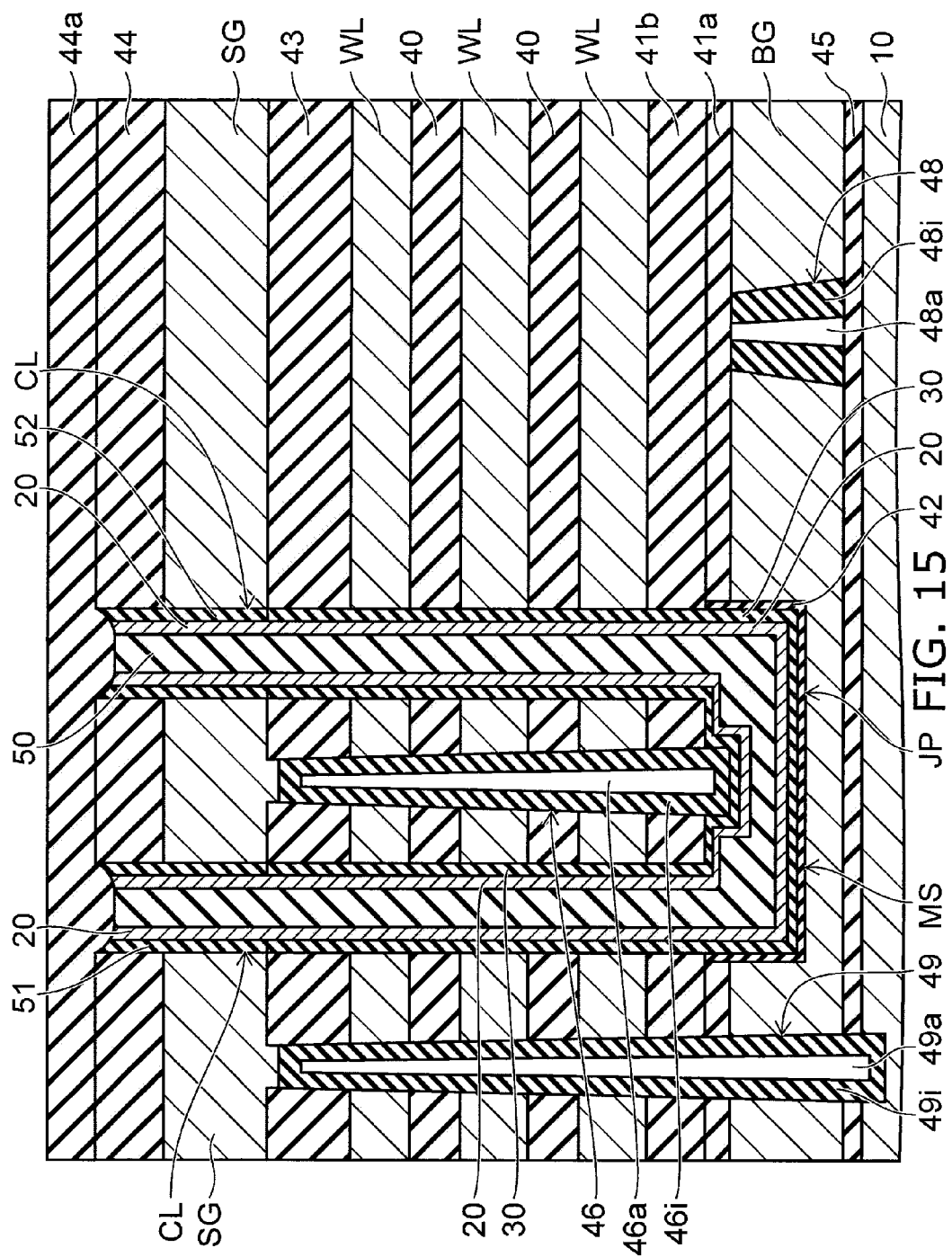
Figure 16:
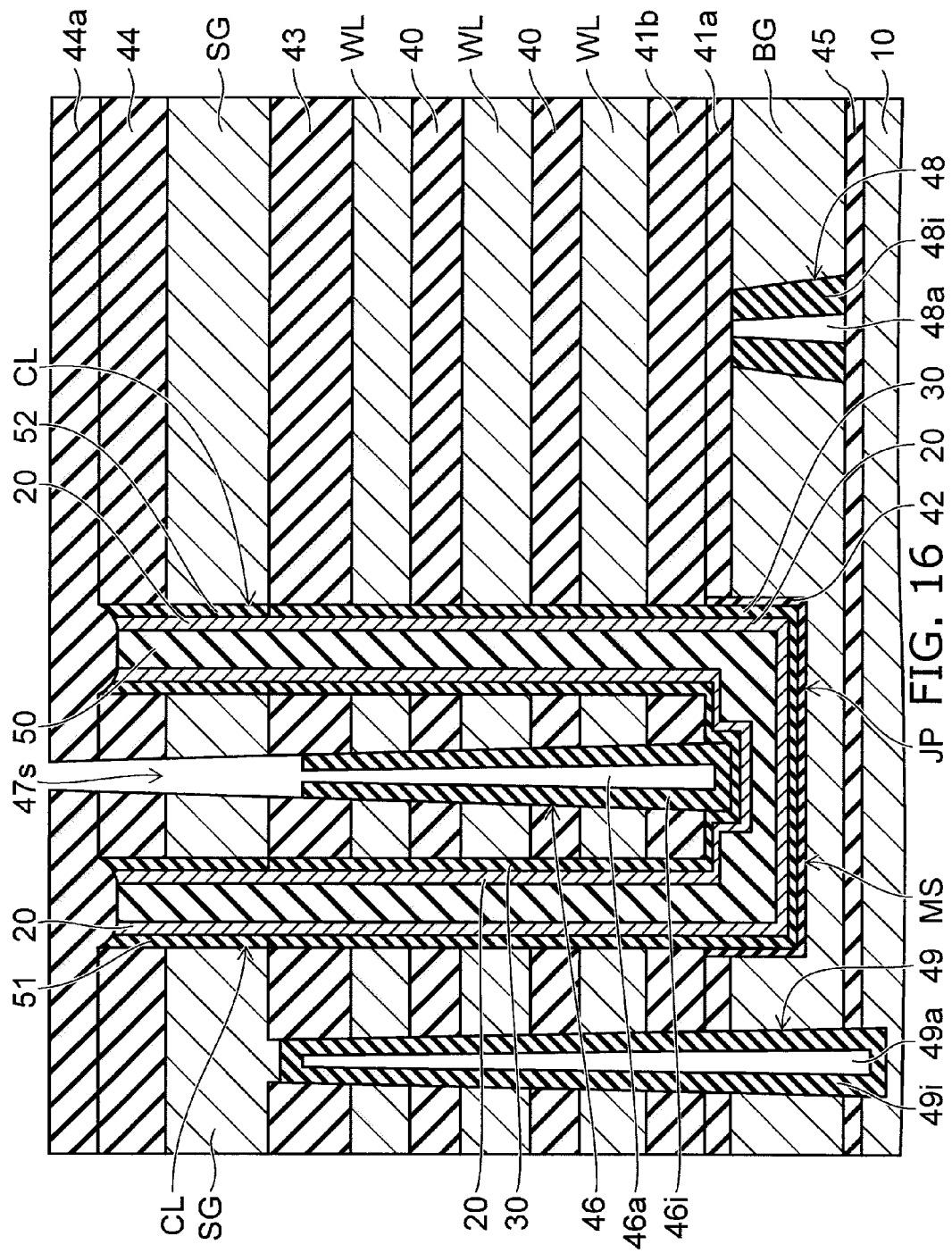

As shown in FIG. 15, an insulating layer 44a is formed on the insulating layer 44 and the columnar sections CL. Thereafter, as shown in FIG. 16, a slit 47s (a device separating section of a selection gate) is formed by the RIE method using a not-shown mask layer formed on the insulating layer 44a. For example, the mask layer includes a carbon layer formed on the insulating layer 44a and a resist film formed on the carbon layer.

The slit 47s pierces through the selection gate SG and separates the selection gate SG into the drain side selection gate SGD and the source side selection gate SGS.

Conditions of the RIE are appropriately controlled to form the sidewall of the slit 47s in a reverse taper shape. That is, the width on the upper end (opening) side of the slit 47s is smaller than the width on the lower end (bottom) side.

Figure 17:
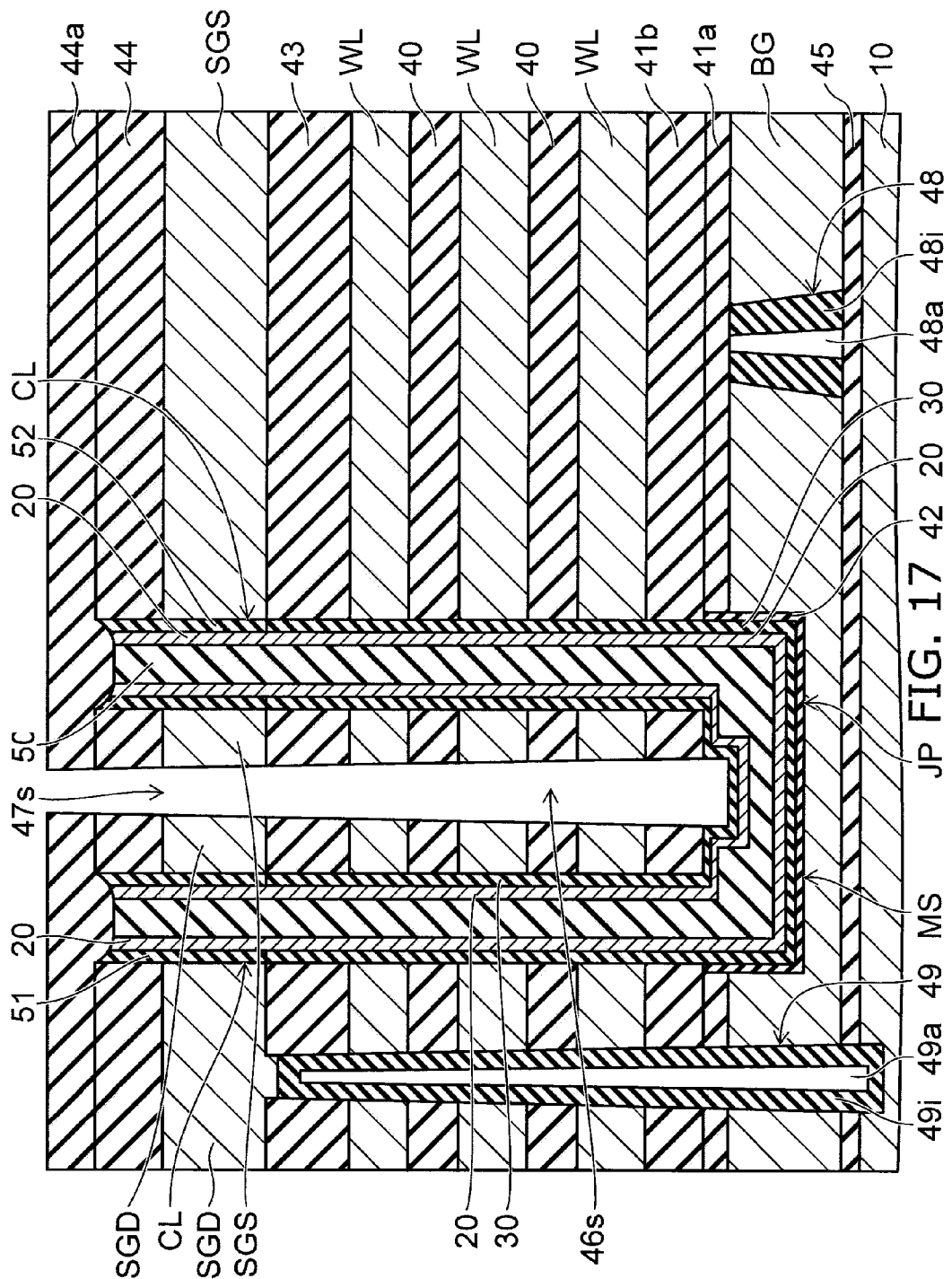

Subsequently, the insulating film 46i under the slit 47s is removed via the slit 47s by, for example, hot phosphoric acid treatment. Consequently, as shown in FIG. 17, the slit 47s is joined to the slit 46s in the stacking direction.

Thereafter, for example, a metal film (e.g., a nickel film) is conformally formed on the insulating layer 44a and on the sidewall of the slit 47s and the sidewall of the slit 46s and high-temperature annealing is performed. Consequently, silicon included in the electrode layers WL and the selection gates SGD and SGS and metal (e.g., nickel) react with each other. Metal silicide (e.g., nickel silicide) is formed on the selection gates SGD and SGS adjacent to the slit 47s and the electrode layers WL adjacent to the slit 46s. Consequently, the resistance of the electrode layers WL and the selection gates SGD and SGS decreases. Thereafter, an unnecessary unreacted metal (nickel) film is removed using, for example, a chemical including sulfuric acid.

Subsequently, as shown in FIG. 2, insulating films 46i and 47i are formed on the insulating layer 44a and in the slit 47s and in the slit 46s. The width on the upper end (opening end) side of the slit 47s is small compared with the bottom (lower end) side of the slit 46s joined to the slit 47s. Therefore, by appropriately controlling film formation conditions of the insulating films 46i and 47i, it is possible to close the upper end of the slit 47s with the insulating film 47i while leaving the air gaps 46a and 47a in the slits 46s and 47s.

After the insulating films 46i and 47i are formed, the insulating film formed on the insulating layer 44a is removed by the RIE method.

Consequently, as shown in FIG. 2, the insulating and separating sections 46 and 47 including the insulating films 46i and 47i and the air gaps 46a and 47a are formed in the stacked body including the electrode layers WL and the selection gates SGD and SGS. The insulating films 46i and 47i are formed on the sidewalls of the insulating and separating sections 46 and 47. The air gaps 46a and 47a are formed on the inner sides of the insulating films 46i and 47i.

The sidewall of the electrode layer WL adjacent to the insulating and separating section 46 is covered with the insulating film 46i. The insulating film 46i is also formed in the bottom of the insulating and separating section 46. The sidewalls of the drain side selection gate SGD and the source side selection gate SGS adjacent to the insulating and separating section 47 are covered with the insulating film 47i. The insulating film 47i is also formed in the upper end section of the insulating and separating section 47.

The outer circumference of the air gap 46a is surrounded by the insulating film 46i. The lower end of the air gap 46a is also covered with the insulating film 46i. The outer circumference of the air gap 47a is surrounded by the insulating film 47i. The upper end of the air gap 47a is also covered with the insulating film 47i.

The insulating film 46i and the insulating film 47i are integrally formed of the same material. In a closed region surrounded by the insulating film 46i and the insulating film 47i, the air gap 46a and the air gap 47a are joined in the stacking direction.

Thereafter, the source layer SL, the bit lines BL, and the like shown in FIG. 1 are formed on the insulating layer 44. Consequently, the semiconductor memory device of the embodiment is obtained. It is possible to realize improvement of reliability and an increase in speed.

Figure 18:
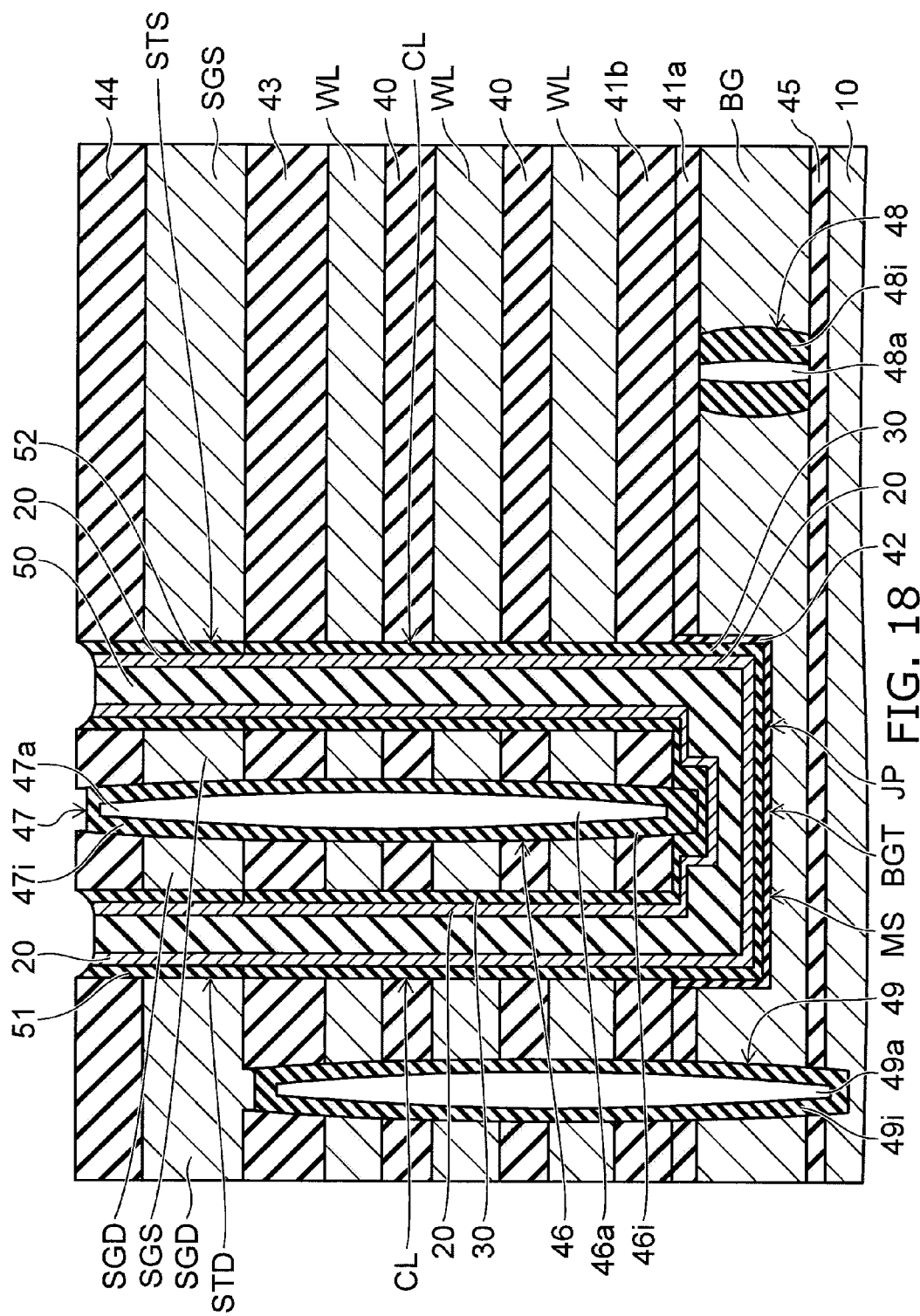
FIG. 18 to FIG. 22 are schematic sectional views of the semiconductor memory device of an another embodiment.

FIG. 18 is a schematic sectional view of a semiconductor memory device in another embodiment. As shown in FIG. 18, the sidewalls of insulating and separating sections are formed in a bowing shape (a shape in which the width in the center in a stacking direction is larger than the width on the upper end side and larger than the width on the lower end side).

In this case, as in the first embodiment, the width on a slit upper end (opening end) side is smaller than the center. Therefore, by appropriately controlling film formation conditions of insulating films formed in slits, it is possible to close the upper ends of the slits with the insulating films while leaving air gaps in the slits. Consequently, air gaps are formed on the inner sides of the insulating and separating sections. Therefore, it is possible to reduce parasitic capacitance, reduce a leak current, and improve a breakdown voltage between conductive devices. It is possible to realize improvement of reliability and an increase in speed of the semiconductor memory device.

Figure 19:
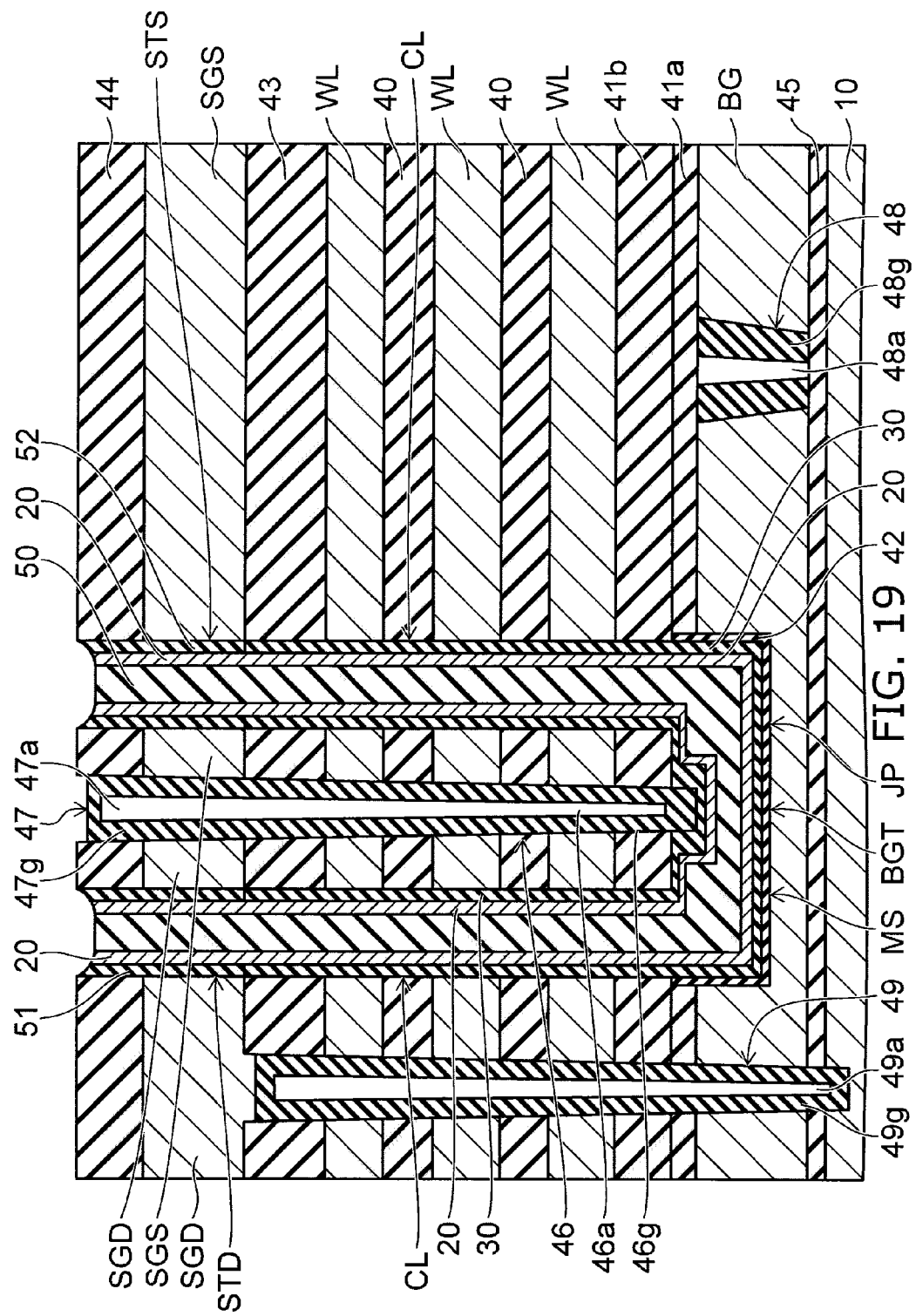
Figure 20:
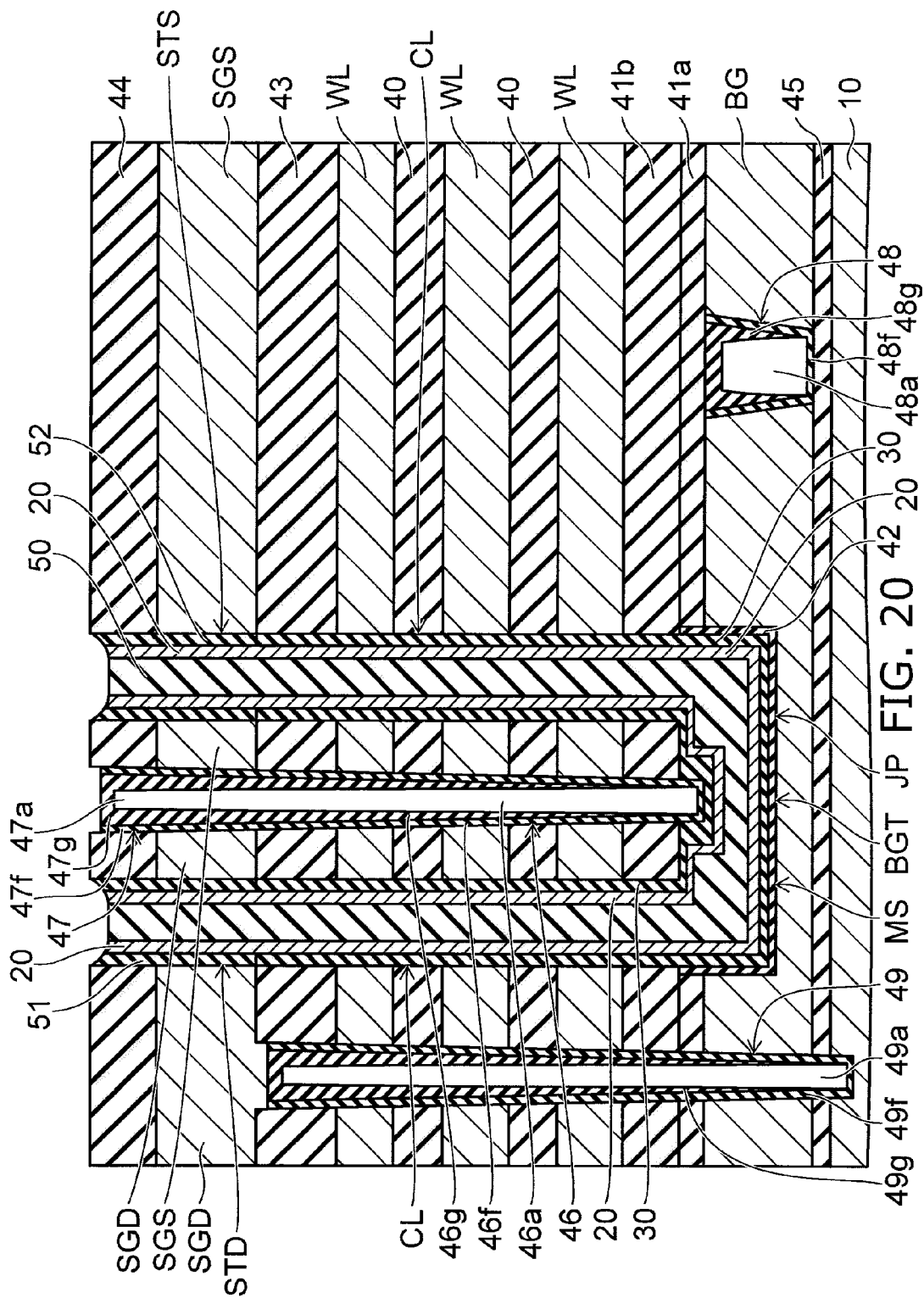

FIGS. 19 and 20 are schematic sectional views of a semiconductor memory device in still another embodiment. As shown in FIG. 19, the sidewalls of insulating and separating sections are formed in a forward taper shape (a shape in which the width on the upper end side is larger than the width on the upper end side).

In this case, insulating films (46g, 47g, 48g, and 49g) having poor coverage are formed in slits. Consequently, it is possible to close the upper ends of the slits with the insulating films 46g, 47g, 48g, and 49g while leaving air gaps in the slits.

The film having poor coverage means that, when the film is formed on the structure of a certain projected section, the thickness of an upper section is larger than the thickness of a sidewall and, when the film is formed on the structure of a recessed section, the thickness of a flat section of an upper section is larger than the thickness of a narrowed place of the recessed section. That is, when the film having poor coverage is formed on the inside of the insulating and separating section, the thickness of the film on the upper end side of the insulating and separating section is larger than the thickness of the film on the lower end side of the insulating and separating section.

On the other hand, a film having good coverage means that, when the film is formed on the structure of a certain projected section, the thickness of an upper section is substantially equal to the thickness of a sidewall and, when the film is formed on the structure of a recessed section, the thickness of a flat section of an upper section is substantially equal to the thickness of a narrowed place of the recessed section.

When the films having poor coverage are formed in the slits having the forward taper shape shown in FIG. 19, it is possible to close the upper ends of the slits with the insulating films while leaving the air gaps in the slits. Note that, when the films having poor coverage are formed, it is possible to form the air gaps irrespective of the shape of the slits.

On the other hand, when the films having good coverage are formed in the slits having the forward taper shape, it is difficult to close the upper sections of the slits in a state in which the air gaps are left in the slits.

Therefore, as shown in FIG. 20, first, after films (46f, 47f, 48f, and 49f) having good coverage are formed on the sidewalls of the slits having the forward taper shape, the films (46g, 47g, 48g, and 49g) having poor coverage are formed on the sidewalls of the slits.

That is, the films having good coverage (cover films) that cover the sidewalls of the stacked body are formed in the insulating and separating sections. Thereafter, the films having poor coverage (closing films) that close the upper ends of the slits are formed on the inner sides of the films having good coverage. Consequently, even in the slits having the forward taper shape, it is possible to cover the sidewalls of the electrode layers WL and the selection gates SGD and SGS with the insulating films and close the upper ends of the slits with the insulating films while leaving the air gaps in the slits.

The insulating films 46g, 47g, 48g, 49g, 46f, 47f, 48f, and 49f are insulating films containing at least any one or more of, for example, silicon nitride, silicon oxide, aluminum oxide, tantalum oxide, and titanium oxide.

In the embodiment, as in the embodiments described above, it is possible to reduce parasitic capacitance, reduce a leak current, and improve a breakdown voltage between conductive devices. It is possible to realize improvement of reliability and an increase in speed of the semiconductor memory device.

Figure 21:
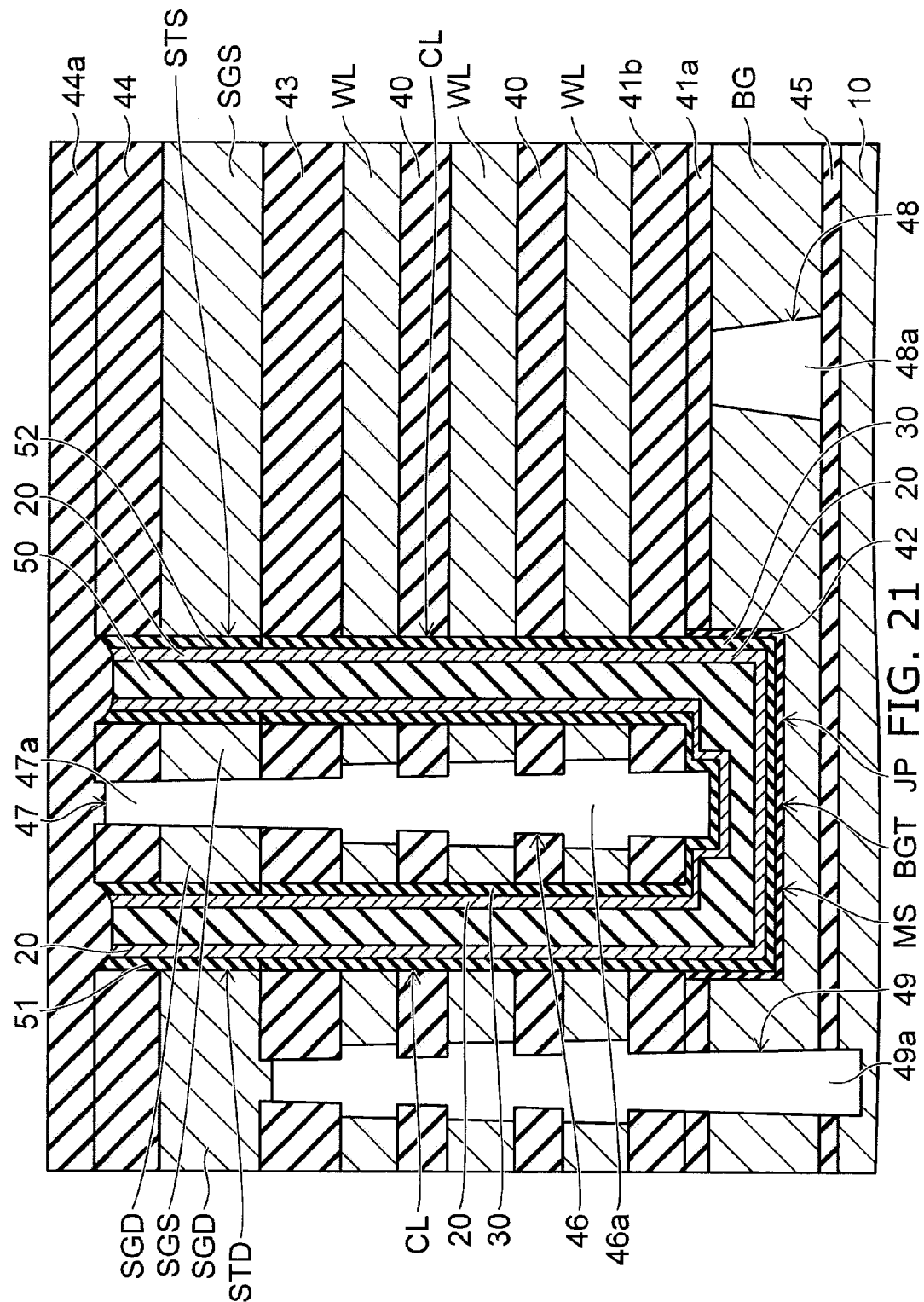
Figure 22:
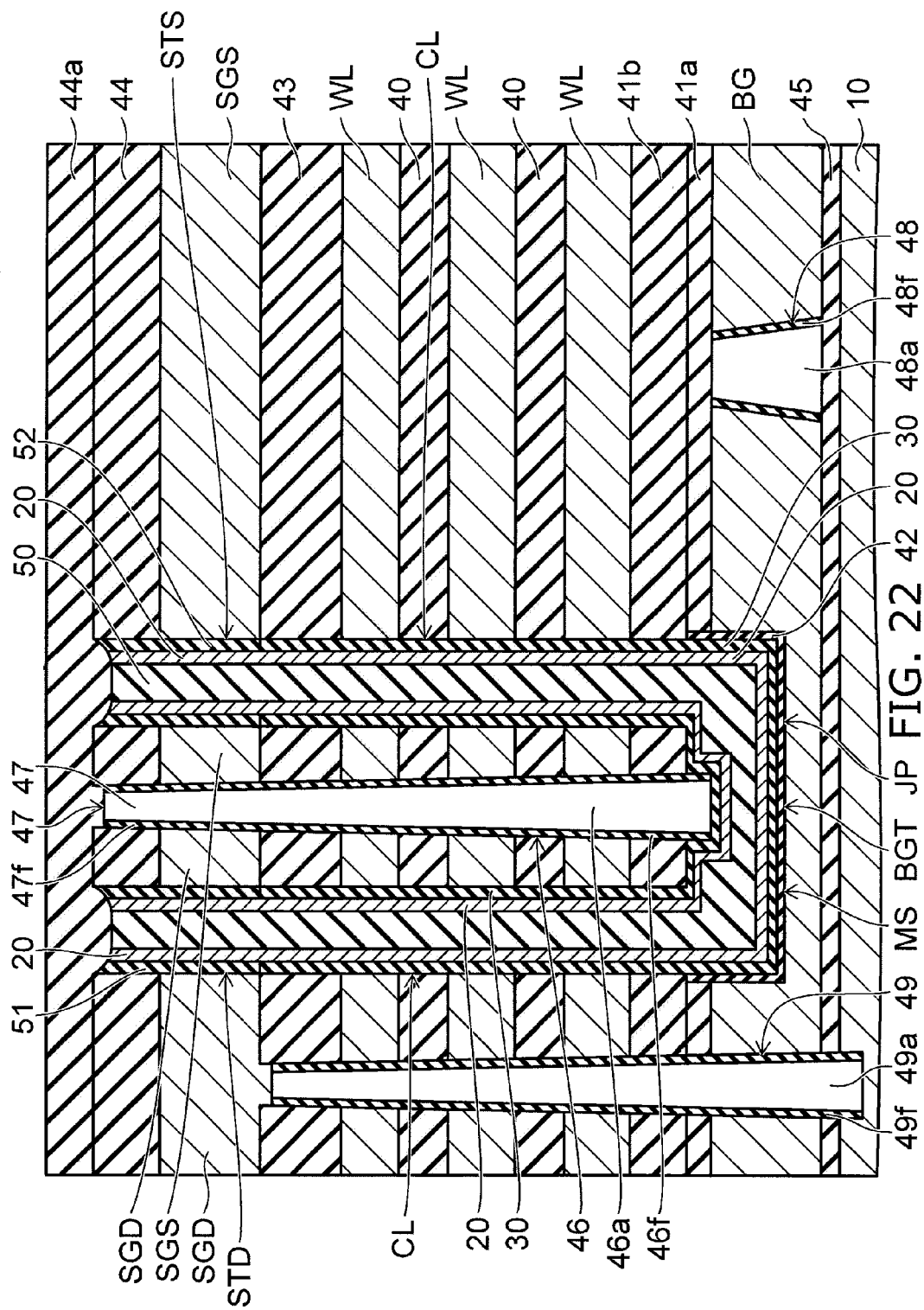

FIGS. 21 and 22 are schematic sectional views of a semiconductor memory device in still another embodiment. As shown in FIG. 21, the insulating and separating sections 46 to 49 do not include insulating films. Only air gaps are formed in the insulating and separating sections 46 to 49. Since the insulating and separating sections 46 to 49 include the air gaps, as in the embodiments described above, it is possible to reduce parasitic capacitance, reduce a leak current, and improve a breakdown voltage in the insulating and separating sections 46 to 49.

When the sidewalls of the electrode layers WL are exposed to the air gaps, there is concern about a breakdown voltage and a leak current among the electrode layers WL in the stacking direction.

On the other hand, according to the embodiment shown in FIG. 21, in portions of the stacked body in contact with the insulating and separating sections, the electrode layers WL are formed to hollow in a direction further away from the center axes of the slits than the insulating layers 40. The insulating layers 40 project further to the center axes side of the slits than the sidewalls of the electrode layers WL among the electrode layers WL in the stacking direction. Steps are formed between the projecting portions of the insulating layers 40 and the sidewalls of the electrode layers WL. Consequently, it is possible to suppress an electric current that leaks among the electrode layers WL, which are stacked across the insulating layers 40, through the sidewalls of the electrode layers WL.

As shown in FIG. 22, the insulating films (the cover films) 46f, 47f, 48f, and 49f having good coverage may be formed on the sidewalls of the slits. The closing films that close the upper ends of the air gaps may not be formed on the inner sides of the cover films. The portions of the electrode layers WL in contact with the insulating and separating sections are covered with the insulating films 46f, 47f, 48f, and 49f.

Consequently, it is possible to suppress a leak current that flows among the electrode layers WL in the stacking direction through the sidewalls of the electrode layers WL.

In the embodiment, as in the embodiments described above, it is possible to reduce parasitic capacitance, reduce a leak current, and improve a breakdown voltage between conductive devices. It is possible to realize improvement of reliability and an increase in speed of the semiconductor memory device.

Figure 23:
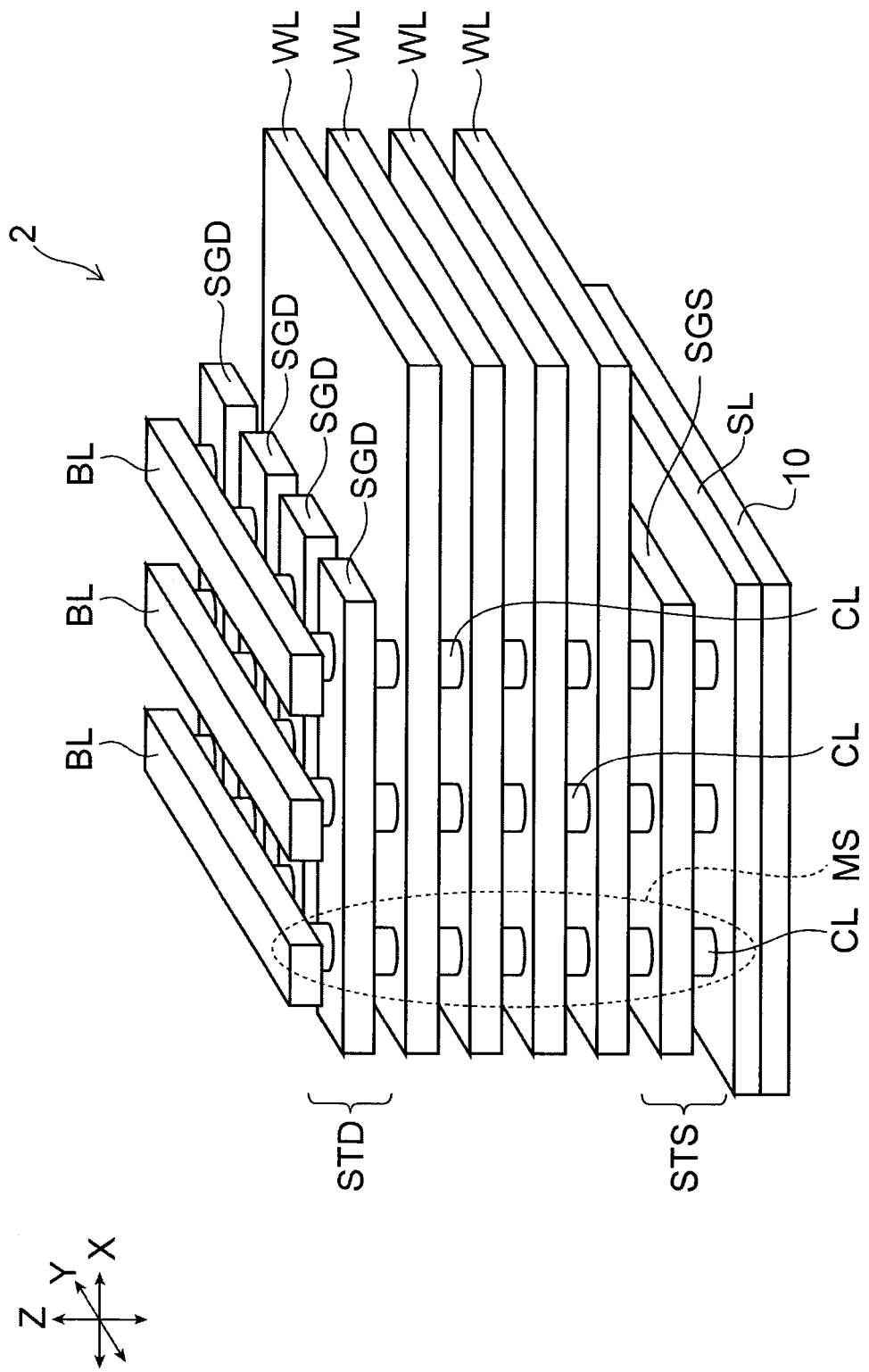
FIG. 23 is a schematic perspective view of a memory cell array of another example of the semiconductor memory device of the embodiment.

FIG. 23 is a schematic perspective view of a memory cell array 2 of another example of the semiconductor memory device of the embodiment. Note that, in FIG. 23, as in FIG. 1, illustration of insulating layers and the like is omitted to clearly show the figure.

In FIG. 23, two directions parallel to the major surface of the substrate 10 and orthogonal to each other are represented as an X-direction and a Y-direction. A direction orthogonal to both of the X-direction and the Y-direction is represented as a Z-direction (a stacking direction).

The source layer SL is provided on the substrate 10. The source side selection gate (the lower selection gate) SGS is provided on the source layer SL via an insulating layer.

An insulating layer is provided on the source side selection gate SGS. A stacked body in which a plurality of electrode layers WL and a plurality of insulating layers are alternately stacked is provided on the insulating layer.

An insulating layer is provided on the top electrode layer WL. The drain side selection gates (the upper selection gates) SGD are provided on the insulating film.

The columnar sections CL extending in the Z-direction are provided in the stacked body. That is, the columnar sections CL pierce through the drain side selection gates SGD, the plurality of electrode layers WL, and the source side selection gate SGS. The upper ends of the channel bodies 20 in the columnar sections CL are connected to the bit lines BL. The lower ends of the channel bodies 20 are connected to the source layer SL.

In the memory cell array 2 shown in FIG. 23, as in the embodiments described above, it is possible to realize improvement of reliability and an increase in speed by forming air gaps in the insulating and separating sections that separate the electrode layers WL, the drain side selection gates SGD, and the source side selection gate SGS.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:
1. A semiconductor memory device, comprising:
a stacked body including a plurality of electrode layers separately stacked each other;
a plurality of columnar sections provided in the stacked body and extending in a stacking direction of the stacked body; and
a first insulating section extending in the stacking direction and in a first direction crossing to the stacking direction, the first insulating section separating the stacked body, the first insulating section including a first air gap, the respective columnar sections including:
- a semiconductor body extending in the stacking direction; and
- a charge storage film provided between the semiconductor body and the plurality of electrode layers.

2. The device according to claim 1, wherein the first insulating section further includes a first insulating film provided between a sidewall of the stacked body and the first air gap, the first insulating film surrounding the first air gap.

3. The device according to claim 2, wherein a thickness of the first insulating film on an upper end side of the first insulating section is larger than a thickness of the first insulating film on a lower end side of the first insulating section.

4. The device according to claim 2, wherein the first insulating film includes at least any one of silicon nitride, silicon oxide, aluminum oxide, tantalum oxide, and titanium oxide.

5. The device according to claim 1, further comprising:
- a lower gate layer provided under the stacked body; and
- a joining section provided in the lower gate layer and joining at least lower ends of a pair of the columnar sections adjacent to each other.

6. The device according to claim 5, wherein the first insulating section separates the stacked body between the pair of columnar sections.

7. The device according to claim 5, further comprising a second insulating section separating the lower gate layer and including a second air gap.

8. The device according to claim 7, wherein the second insulating section further includes a second insulating film provided between a sidewall of the lower gate layer and the second air gap, the second insulating film surrounding the second air gap.

9. The device according to claim 8, wherein the second insulating film includes at least any one of silicon nitride, silicon oxide, aluminum oxide, tantalum oxide, and titanium oxide.

10. The device according to claim 7, wherein the second insulating section includes:
- a cover insulating film covering a sidewall of the lower gate layer; and
- a closing film provided on an inner side of the cover insulating film and closing an upper end of the second air gap.

11. The device according to claim 1, further comprising:
an upper gate layer provided on the stacked body; and
a third insulating section separating the upper gate layer and including a third air gap.

12. The device according to claim 11, wherein the third insulating section further includes a third insulating film provided between a sidewall of the upper gate layer and the third air gap, the third insulating film surrounding the third air gap.

13. The device according to claim 12, wherein the third insulating film includes at least any one of silicon nitride, silicon oxide, aluminum oxide, tantalum oxide, and titanium oxide.

14. The device according to claim 11, wherein the first air gap and the third air gap are joined in the stacking direction.

15. The device according to claim 14, wherein the first insulating section and the third insulating section include:
- a cover insulating film covering a sidewall of the stacked body; and
- a closing film provided on inner side of the cover insulating film and closing an upper end of the third air gap.

16. The device according to claim 15, wherein a thickness of the closing film on an upper end side of the third insulating section is larger than a thickness of the closing film on a lower end side of the first insulating section.

17. The device according to claim 1, wherein a width on an upper end side of the first insulating section is larger than a width on a lower end side of the first insulating section.

18. The device according to claim 1, wherein a width on a lower end side of the first insulating section is larger than width on an upper end side of the first insulating section.

19. The device according to claim 1, wherein a width in a center in the stacking direction of the first insulating section is larger than a width on an upper end side of the first insulating section and larger than a width on a lower end side of the first insulating section.

20. A method for manufacturing a semiconductor memory device, comprising:
forming a stacked body including a plurality of electrode layers separately stacked each other;
forming a hole extending in a stacking direction of the stacked body piercing through the stacked body;
forming a film including a charge storage film on a sidewall of the hole;
forming a semiconductor body on a sidewall of the film including the charge storage film;
forming a slit piercing through the stacked body and separating the stacked body, the slit extending in the stacking direction and in a first direction crossing to the stacking direction: and
closing an upper end of the slit while leaving an air gap in the slit.

* * * * *